US 9,265,104 B2

(12) United States Patent
Szczeszynski et al.

(10) Patent No.: US 9,265,104 B2
(45) Date of Patent: Feb. 16, 2016

(54) ELECTRONIC CIRCUITS AND TECHNIQUES FOR MAINTAINING A CONSISTENT POWER DELIVERED TO A LOAD

(75) Inventors: Gregory Szczeszynski, Hollis, NH (US); Vijay Mangtani, Nashua, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 786 days.

(21) Appl. No.: 13/177,075

(22) Filed: Jul. 6, 2011

(65) Prior Publication Data

US 2013/0009556 A1  Jan. 10, 2013

(51) Int. Cl.
H05B 37/02 (2006.01)
H05B 33/08 (2006.01)
H03K 7/08 (2006.01)

(52) U.S. Cl.
CPC .............. *H05B 33/0815* (2013.01); *H03K 7/08* (2013.01); *H05B 33/0827* (2013.01)

(58) Field of Classification Search
CPC ...... H03K 7/08; H05B 33/0815; H05B 37/02; G05F 1/618
USPC ...... 315/186, 209 R, 210, 291, 294, 299, 308
See application file for complete search history.

(56) References Cited

U.S. PATENT DOCUMENTS

| | | | |
|---|---|---|---|
| 4,739,226 A | 4/1988 | Murata | |
| 5,905,387 A | 5/1999 | Chinosi et al. | |
| 6,222,385 B1 | 4/2001 | Kang | |
| 6,271,693 B1 | 8/2001 | Shi et al. | |
| 6,400,715 B1 | 6/2002 | Beaudoin et al. | |
| 6,621,235 B2 | 9/2003 | Chang | |
| 6,636,104 B2 | 10/2003 | Henry | |
| 6,690,146 B2 | 2/2004 | Burgyan et al. | |
| 6,822,403 B2 | 11/2004 | Horiuchi et al. | |

(Continued)

FOREIGN PATENT DOCUMENTS

| | | |
|---|---|---|
| EP | 1 079 667 A2 | 2/2001 |
| EP | 1 079 667 A3 | 2/2001 |

(Continued)

OTHER PUBLICATIONS

U.S. Appl. No. 14/147,167, filed Jan. 7, 2014, Szczeszynski et al.

(Continued)

*Primary Examiner* — Tuyet Vo
*Assistant Examiner* — Henry Luong
(74) *Attorney, Agent, or Firm* — Daly, Crowley, Mofford & Durkee, LLP

(57) ABSTRACT

Circuits and methods used therein provide an adjustable average current through a load in accordance with a pulse width modulated (PWM) signal. A condition detection circuit is configured to identify a condition of the electronic circuit and to generate a condition signal indicative of the condition. A current extension circuit is coupled receive the condition signal and coupled to receive the PWM signal. The current extension circuit is configured to generate, at the output node of the current extension circuit, an extended PWM signal having a first state and a second state. The first state of the extended PWM signal longer in time than a first state of the PWM signal by an amount related to a value or a state of the condition signal. Current pulses through the load are extended to be longer in accordance with the extended PWM signal.

43 Claims, 11 Drawing Sheets

(56) References Cited

U.S. PATENT DOCUMENTS

| | | |
|---|---|---|
| 6,930,679 B2 | 8/2005 | Wu et al. |
| 6,963,175 B2 | 11/2005 | Archenhold et al. |
| 7,116,086 B2 | 10/2006 | Burgyan et al. |
| 7,129,679 B2 | 10/2006 | Inaba et al. |
| 7,148,632 B2 | 12/2006 | Berman et al. |
| 7,235,954 B2 | 6/2007 | Murakami |
| 7,291,989 B2 | 11/2007 | Namba et al. |
| 7,307,614 B2 | 12/2007 | Vinn |
| 7,317,403 B2 | 1/2008 | Grootes et al. |
| 7,375,472 B2 | 5/2008 | Wong et al. |
| 7,466,082 B1 | 12/2008 | Snyder et al. |
| 7,479,743 B2 | 1/2009 | Namba et al. |
| 7,482,765 B2 | 1/2009 | Ito et al. |
| 7,528,551 B2 | 5/2009 | Ball |
| 7,675,245 B2 | 3/2010 | Szczeszynski et al. |
| 7,675,246 B2 | 3/2010 | Chiang et al. |
| 7,928,670 B2 | 4/2011 | Chen et al. |
| 7,999,487 B2 | 8/2011 | Szczeszynski |
| 8,169,161 B2 | 5/2012 | Szczeszynski et al. |
| 8,274,238 B2 | 9/2012 | Szczeszynski et al. |
| 8,482,225 B2 | 7/2013 | Szczeszynski |
| 8,653,756 B2 | 2/2014 | Szczeszynski et al. |
| 8,957,607 B2 | 2/2015 | Raval et al. |
| 2003/0110344 A1 | 6/2003 | Szczepanek et al. |
| 2004/0051478 A1 | 3/2004 | Otake et al. |
| 2004/0080273 A1 | 4/2004 | Ito et al. |
| 2004/0251854 A1 | 12/2004 | Matsuda et al. |
| 2004/0251942 A1 | 12/2004 | Chiu et al. |
| 2005/0007085 A1 | 1/2005 | Murakami |
| 2005/0088207 A1 | 4/2005 | Rader et al. |
| 2005/0104542 A1 | 5/2005 | Ito et al. |
| 2005/0110469 A1 | 5/2005 | Inaba et al. |
| 2005/0156540 A1 | 7/2005 | Ball |
| 2005/0243022 A1 | 11/2005 | Negru |
| 2005/0243041 A1 | 11/2005 | Vinn |
| 2006/0022916 A1 | 2/2006 | Aiello |
| 2006/0028147 A1 | 2/2006 | Shinmen et al. |
| 2006/0114954 A1 | 6/2006 | Wong et al. |
| 2006/0125320 A1 | 6/2006 | Namba et al. |
| 2006/0139299 A1 | 6/2006 | Tsuchiya |
| 2006/0170287 A1 | 8/2006 | Ito et al. |
| 2006/0250824 A1 | 11/2006 | Wekhande et al. |
| 2006/0259648 A1 | 11/2006 | Agarwala et al. |
| 2007/0120506 A1 | 5/2007 | Grant |
| 2007/0182701 A1 | 8/2007 | Kim et al. |
| 2007/0267978 A1 | 11/2007 | Shteynberg et al. |
| 2008/0048573 A1 | 2/2008 | Ferentz et al. |
| 2008/0110469 A1 | 5/2008 | Weinberg |
| 2008/0144236 A1 | 6/2008 | Chiang et al. |
| 2008/0164828 A1 | 7/2008 | Szczeszynski et al. |
| 2008/0243041 A1 | 10/2008 | Brenner et al. |
| 2009/0021384 A1 | 1/2009 | Jacubovski et al. |
| 2009/0128045 A1 | 5/2009 | Szczeszynski et al. |
| 2009/0195183 A1 | 8/2009 | Yang |
| 2009/0212717 A1 | 8/2009 | Trattler |
| 2009/0289559 A1 | 11/2009 | Tanaka et al. |
| 2009/0302776 A1 | 12/2009 | Szczeszynski et al. |
| 2010/0019696 A1* | 1/2010 | Kimura .................. 315/297 |
| 2010/0052552 A1 | 3/2010 | Kimura |
| 2010/0060177 A1 | 3/2010 | Takata et al. |
| 2010/0066255 A1 | 3/2010 | Roberts |
| 2010/0072922 A1 | 3/2010 | Szczeszynski et al. |
| 2010/0109550 A1 | 5/2010 | Huda et al. |
| 2010/0140621 A1 | 6/2010 | Yang et al. |
| 2010/0148691 A1 | 6/2010 | Kuo et al. |
| 2010/0164581 A1 | 7/2010 | Zhang et al. |
| 2010/0207547 A1* | 8/2010 | Kuroki et al. .................. 315/307 |
| 2010/0259177 A1* | 10/2010 | Mednik et al. ............ 315/185 R |
| 2010/0327835 A1 | 12/2010 | Archibald |
| 2011/0026277 A1 | 2/2011 | Strijker |
| 2011/0032008 A1 | 2/2011 | Zhao et al. |
| 2011/0062929 A1 | 3/2011 | Strydom et al. |
| 2011/0133645 A1 | 6/2011 | Kuo et al. |
| 2011/0204947 A1 | 8/2011 | Qiu et al. |
| 2011/0234122 A1 | 9/2011 | Yu et al. |
| 2011/0298384 A1 | 12/2011 | Tanigawa et al. |
| 2012/0133299 A1 | 5/2012 | Capodivacca et al. |
| 2012/0146541 A1 | 6/2012 | Szczeszynski et al. |
| 2012/0181939 A1 | 7/2012 | Szczeszynski et al. |
| 2013/0009557 A1 | 1/2013 | Szczeszynski |
| 2013/0162152 A1 | 6/2013 | Lee et al. |
| 2013/0207632 A1 | 8/2013 | Thandi et al. |
| 2014/0055045 A1 | 2/2014 | Raval et al. |
| 2014/0125236 A1 | 5/2014 | Szczeszynski et al. |
| 2014/0176018 A1 | 6/2014 | Szczeszynski et al. |

FOREIGN PATENT DOCUMENTS

| | | |
|---|---|---|
| EP | 1 499 165 | 1/2005 |
| EP | 1 499 165 A2 | 1/2005 |
| JP | 3-196280 | 8/1991 |
| JP | H06-044807 | 2/1994 |
| JP | H11-507750 A | 7/1999 |
| JP | 2002-257871 A | 9/2002 |
| JP | 2002-281345 A | 9/2002 |
| JP | 2003-063062 | 3/2003 |
| JP | 2003-215534 | 7/2003 |
| JP | 2004-134147 A | 4/2004 |
| JP | 2005-116738 A | 4/2005 |
| JP | 2005-122979 | 5/2005 |
| JP | 2006-005381 | 1/2006 |
| JP | 3755770 | 3/2006 |
| JP | 3755770 B2 | 3/2006 |
| JP | 2006-158186 A | 6/2006 |
| JP | 2006/185942 | 7/2006 |
| JP | 2006-185942 | 7/2006 |
| JP | 2006-521659 A | 9/2006 |
| JP | 2006-318326 A | 11/2006 |
| JP | 2005-122979 | 5/2007 |
| JP | 2006/129862 | 5/2007 |
| JP | 2007-120506 | 5/2007 |
| JP | 2007-129862 | 5/2007 |
| JP | 2008-311602 A | 12/2008 |
| KR | 10-2005-0006042 | 1/2005 |
| KR | 1020050006042 A | 1/2005 |
| WO | WO 00/013310 | 3/2000 |
| WO | WO 02/03087 A1 | 1/2002 |
| WO | WO 2006/136321 A1 | 12/2006 |
| WO | WO 2007/043389 A1 | 4/2007 |
| WO | WO 2007/096868 A1 | 8/2007 |
| WO | WO 2007/126640 A2 | 11/2007 |
| WO | WO 2007/126640 A3 | 11/2007 |
| WO | WO 2008/086050 A2 | 7/2008 |
| WO | WO 2008/086050 A3 | 7/2008 |
| WO | WO 2009/064682 A2 | 5/2009 |
| WO | WO 2009/064682 A3 | 5/2009 |
| WO | WO 2009/157763 | 12/2009 |
| WO | WO 2009/157763 A2 | 12/2009 |
| WO | WO 2010/000475 A1 | 1/2010 |
| WO | WO 2010/004475 A1 | 1/2010 |
| WO | WO 2013/006272 A1 | 1/2013 |

OTHER PUBLICATIONS

PCT International Preliminary Report on Patentability and Written Opinion of the ISA dated Jan. 16, 2014; for PCT Pat. App. No. PCT/US2012/043275; 6 pages.

PCT International Preliminary Report on Patentability and Written Opinion dated Jan. 16, 2014; for PCT Pat. App. No. PCT/US2012/044149; 7 pages.

Letter from Yuasa and Hara dated Mar. 14, 2014; for Japanese Pat. App. No. 2010-534111; 1 page.

Japanese Notice of Allowance received Mar. 14, 2014; for Japanese Pat. App. No. 2010-534111; 3 pages.

Notification of Transmittal of the International Search Report and the Written Opinion of the International Searching Authority, or the Declaration, PCT/US2012/043275, Date of Mailing: Sep. 4, 2012, 10 pages.

Notification of Transmittal of the International Search Report and the Written Opinion of the International Searching Authority, or the Declaration, PCT/US2012/044149, Date of Mailing: Oct. 1, 2012, 11 pages.

(56) References Cited

OTHER PUBLICATIONS

Office Action dated Jun. 20, 2014 for U.S. Appl. No. 13/177,070, filed Jul. 6, 2011 25 pages.
U.S. Appl. No. 13/591,564, filed Aug. 22, 2012, Raval et al.
U.S. Appl. No. 13/752,904, filed Jan. 29, 2013, Raval et al.
U.S. Appl. No. 14/149,167, filed Jan. 7, 2014, Szczeszynski et al.
Allegro Microsystems, Inc. A8432 and A8433 Data Sheets; WLED Backlight Drivers with True Shutdown and OVP; Jan. 25, 2005; pp. 1-6.
Allegro Microsystems, Inc.; A8500 Data Sheet; "Flexible WLED/RGB Backlight Driver for Medium Size LCD's," Dec. 8, 2006; pp. 1-15.
Allegro Microsystems, Inc., Data Sheet A8501; "2 MHz, 4 channel × 100 mA WLED/RGB Driver with Output Disconnect;" Jan. 2008-2010; pp. 1-24.
Allegro Microsystems, Inc., Data Sheet A8502; "Wide Input Voltage Range, High Efficiency Fault Tolerant LED Driver;" Jan. 16, 2012; pp. 1-35.
Allegro Microsystems, Inc., Data Sheet A8503; "High Efficiency 6-Channel, 2 MHz, WLED/RGB Driver for Medium Displays, with Integrated 55 V Power Switch;" Jan. 2009; pp. 1-17.
Allegro Microsystems, Inc., Data Sheet A8504, "WLED/RGB Backlight Driver for Medium Size LCDs;" Jan. 2007-2009; pp. 1-18.
Allegro Microsystems, Inc., Data Sheet A8508; "Wide Input Voltage Range, High Efficiency 8-Channel Fault Tolerant LED Driver;" Jul. 9, 2012; pp. 1-28.
Bakker et al.; "A CMOS Nested-Chopper Instrumentation Amplifier with 100-nV Offset;" IEEE Journal of Solid-State Circuits; vol. 35, No. 12; Dec. 2000; pp. 1877-1883.
Burkhart et al.; "A Monolithically Integrated 128 LED-Driver and its Application;"IEEE Transactions on Consumer Electronics; vol. CE-32, No. 1; Feb. 1986, pp. 26-31.
Linear Technology; Design Note 154; Short-Circuit Protection for Boost Regulators; 1997; pp. 1-2.
Maxim Data Sheet; MAX1570; "White LED Current Regulator with 1x/1.5x High-Efficiency Charge Pump;" #19-2526; Jul. 2002; pp. 1-12.
Maxim Data Sheet; MAX1574; "180mA, 1x/2x, White LED Charge Pump in 3mm × 3mm TDFN;" #19-3117; Dec. 2003; pp. 1-9.
Maxim Data Sheet; MAX1576; "480mA White LED 1x/1.5x./2x Charge Pump for Backlighting and Camera Flash;" #19-3326; Aug. 2005; pp. 1-14.
Maxim, Data Sheet MAX16807/MAX16808, Integrated 8-Channel LED Drivers with Switch-Mode Boost and SEPIC Controller, Oct. 2006, pp. 1-21.
Maxim; Dallas Semiconductor; "Charge-Pump and Step-Up DC-DC Converter Solutions for Powering White LEDs in Series or Parallel Connections;" Apr. 23, 2002; 15 pages.
Nippon Precision Circuits, Inc.; SM8132A; "White LED Driver IC;" Nippon Precision Circuits, Inc.; May 2005; pp. 1-18.
Rohm, Data Sheet BD6066GU, Silicon Monolithic Integrated Circuit, Apr. 2005, pp. 1-6.
"White LED Driver IC;" NPC Nippon Precision Circuits, Inc.; SM8132A; May 2005; pp. 1-18.
"WLED Backlight Drivers with True Shutdown and OVP;" A8432 and A8433; Allegro MicroSystems, Inc. Concept Data Sheet; Jan. 25, 2005; 6 pages.
Witt; Linear Technology; Design Notes; "Short-Circuit Protection for Boost Regulators;" Jan. 1997, 2 pages.
Office Action dated Sep. 1, 2011; for U.S. Appl. No. 12/267,645; 24 pages.
Response filed Nov. 14, 2011; for U.S. Appl. No. 12/267,645; 7 pages.
Notice of Allowance dated Jan. 11, 2012; for U.S. Appl. No. 12/267,645; 10 pages.
312 Amendment filed Mar. 7, 2012; for U.S. Appl. No. 12/267,645; 4 pages.
Response to 312 Amendment filed Mar. 7, 2012; for U.S. Appl. No. 12/267,645; 2 pages.
Notice of Allowance; dated Oct. 9, 2013; for U.S. Appl. No. 13/428,654; 24 pages.
Office Action; dated Apr. 25, 2013; for U.S. Appl. No. 12/966,139; 20 pages.
Response to Office Action filed Jul. 24, 2013; to Office Action; dated Apr. 25, 2013; for U.S. Appl. No. 12/966,139; 11 pages.
Notice of Allowance dated Sep. 17, 2013; for U.S. Appl. No. 12/966,139; 16 pages.
Request for Continued Examination dated Oct. 29, 2013; for U.S. Appl. No. 12/966,139; 3 pages.
Notice of Allowance dated Nov. 12, 2013; for U.S. Appl. No. 12/966,139; 12 pages.
Taiwan Office Action and Search Report (in English); received Apr. 30, 2013; for TW Pat. App. No. 097144152; 15 pages.
Response to Taiwanese Office Action (with Claims in English); filed Jul. 11, 2013; for TW Pat. App. No. 097144152; 7 pages.
Taiwan Allowance Decision of Examination; dated Aug. 30, 2013; for Taiwanese Pat. App. No. 097144152; 2 pages.
Email from Taiwan International Patent & Law Office; dated Sep. 5, 2013; for Taiwanese Pat. App. No. 097144152; 2 pages.
Japanese Notice of Rejection; dated Feb. 21, 2013; for JP Pat. App. No. 2010-534111; 4 pages.
JP Response to Office Action (with English translation of claims); filed May 20, 2013; for JP Pat. App. No. 2010-534111; 13 pages.
Letter from Yuasa and Hara; dated Jul. 8, 2013; for JP Pat. App. No. 2010-534111; 2 pages.
Japanese Notice of Reasons for Rejection (English Translation); dated Aug. 1, 2013; for Japanese Pat. App. No. 2010-234111; 2 pages.
Letter to Yuasa and Hara; dated Oct. 4, 2013; for Japanese Pat. App. No. 2010-534111; 3 pages.
Japanese Response filed Oct. 11, 2013; for Japanese Pat. App. No. 2010-534111; 4 pages.
Letter from Yuasa and Hara; dated Oct. 21, 2013; for Japanese Pat. App. No. 2010-534111; 1 page.
PCT Partial Search Report and Invitation to Pay Additional Fees dated Jun. 16, 2008 for PCT/US2008/050026.
PCT Search Report and Written Opinion of the ISA for PCT/US2008/050026 dated Aug. 29, 2008.
PCT Search Report and Written Opinion of the ISA of PCT/US2008/082934 mailed Dec. 15, 2009.
PCT International Preliminary Report on Patentability of the ISA dated May 27, 2010 for PCT/US2008/082934, pp. 1-14.
PCT Search Report and Written Opinion of the ISA for PCT/US2011/062500 dated Apr. 3, 2012; 12 pages.
U.S. Appl. No. 11/619,675, filed Jan. 4, 2007 Part 1 of 2; pp. 1-305.
U.S. Appl. No. 11/619,675, filed Jan. 4, 2007 Part 2 of 2; pp. 1-313.
U.S. Pat. No. 7,675,245; Timeframe Dec. 14, 2009-Nov. 29, 2010; 198 pages.
U.S. Pat. No. 8,274,238; Part 1 of 6; 350 pages.
U.S. Pat. No. 8,274,238; Part 2 of 6; 350 pages.
U.S. Pat. No. 8,274,238; Part 3 of 6; 350 pages.
U.S. Pat. No. 8,274,238; Part 4 of 6; 350 pages.
U.S. Pat. No. 8,274,238; Part 5 of 6; 350 pages.
U.S. Pat. No. 8,274,238; Part 6 of 6; 302 pages.
U.S. Pat. No. 7,999,487 issued on Aug. 16, 2011 Part 1 of 5; 400 pages.
U.S. Pat. No. 7,999,487 issued on Aug. 16, 2011 Part 2 of 5; 400 pages.
U.S. Pat. No. 7,999,487 issued on Aug. 16, 2011 Part 3 of 5; 400 pages.
U.S. Pat. No. 7,999,487 issued on Aug. 16, 2011 Part 4 of 5; 400 pages.
U.S. Pat. No. 7,999,487 issued on Aug. 16, 2011 Part 5 of 5; 50 pages.
Szczeszynski et al.; U.S. Appl. No. 12/966,139, filed Dec. 13, 2010; 36 page.
Szczeszynski; U.S. Appl. No. 13/096,082, filed Apr. 28, 2011; 20 pages.
Office Action dated May 28, 2014 for U.S. Appl. No. 13/591,570, filed Aug. 22, 2012.
Notice of Allowance dated Jan. 15, 2015; for U.S. Appl. No. 13/177,070; 20 pages.

(56) References Cited

OTHER PUBLICATIONS

Letter to Yuasa and Hara (including suggested claims) dated Sep. 23, 2014; for Japanese Pat. App. No. 2013-105879; 6 pages.
Japanese Claims as filed on Oct. 3, 2014; for Japanese Pat. App. No. 2013-105879; 4 pages.
312 Amendment filed Jan. 23, 2015; for U.S. Appl. No. 13/177,070; 17 pages.
Japanese Notice of Reasons for Rejection (English translation) dated Jan. 26, 2015; for Japanese Pat. App. No. 2014-078475 4 pages.
Office Action dated Feb. 18, 2015 corresponding to U.S. Appl. No. 14/147,811; 19 pages.
Taiwan Office Action and Search Report (with English Translation) dated Jan. 28, 2015 corresponding to Taiwan Patent Appl. No. 101123896; 13 pages.
Letter to $21^{st}$ Century Patent & Law Firm dated Feb. 4, 2015; for Korean Pat. App. No. 10-2010-7009105; 12 pages.
Letter from $21^{st}$ Century Patent & Law Firm dated Feb. 16, 2015; for Korean Pat. App. No. 10-2010-7009105; 1 page.
Korean Response and Amendment filed Feb. 16, 2015; for Korean Pat. App. No. 10-2010-7009105; 30 pages.
Letter to Taiwan International Patent & Law Office dated Feb. 17, 2015; for Taiwan Pat. App. No. 101123288; 16 pages.
Email from Taiwan International Patent & Law Office dated Mar. 30, 2015; for Taiwan Pat. App. No. 101123288; 2 pages.
Taiwan Amendment and Response received Mar. 30, 2015; for Taiwan Pat. App. No. 101123288; 10 pages.
Taiwan Marked-Up Patent Specification (in English) as filed with Taiwan Argument and Amendment received Mar. 30, 2015; for Taiwan Pat. App. No. 101123288; 37 pages.
International Preliminary Report on Patentability dated Mar. 5, 2015 for International PCT Application No. PCT/US2013/053162; 10 pages.
International Preliminary Report on Patentability dated Mar. 5, 2015 for International PCT Application No. PCT/US2013/053162; 6 pages.
Office Action dated Apr. 3, 2015 for U.S. Appl. No. 13/591,564; 15 pages.
U.S. Appl. No. 14/638,257, filed Mar. 4, 2015, Szczeszynski et al.
PCT Search Report and Written Opinion of the ISA dated Oct. 8, 2013; for PCT Pat. App. No. PCT/US2013/053162; 13 pages.
Letter to Taiwan International Patent and Law Office dated Apr. 17, 2015; for Taiwanese Pat. App. No. 101123896; 16 pages.
Taiwanese Response filed Apr. 29, 2015; for Taiwanese Pat. App. No. 101123896; 4 pages.
Taiwanese Response Claims (translated) filed Apr. 29, 2015; for Taiwanese Pat. App. No. 101123896; 8 pages.
Response filed May 12, 2015; to Office Action dated Apr. 3, 2015; for U.S. Appl. No. 13/591,564; 13 pages.
Japanese Response filed Apr. 13, 2015; for Japanese Pat. App. No. 2014-078475; 6 pages.
Japanese Claims (English translation) filed Apr. 13, 2015; for Japanese Pat. App. No. 2014-078475; 2 pages.
Japanese Notice of Allowance dated May 12, 2015; for Japanese Pat. App. No. 2014-078475; 3 pages.
Japanese Claims as allowed (English translation) dated May 12, 2015; for Japanese Pat. App. No. 2014-078475; 2 pages.
Response to May 28, 2014 Office Action as filed on Aug. 7, 2014 for U.S. Appl. No. 13/591,570, filed Aug. 22, 2012.
Notice of Allowance dated Oct. 9, 2014 for U.S. Appl. No. 13/591,570, filed Aug. 22, 2012.
Response filed Oct. 27, 2014; to Office Action dated Jun. 20, 2014; U.S. Appl. No. 13/177,070; 23 pages.
Taiwan Office Action and Search Report, with English translation, dated Oct. 2, 2014; for Taiwan Pat. App. No. 101123288; 19 pages.
Notice of Allowance dated Dec. 5, 2014; for U.S. Appl. No. 14/149,167; 27 pages.
Korean Notice to Submit a Response dated Nov. 19, 2014; for Korean Pat. App. No. 10-2010-7009105; 3 pages.

Korean Notice of Allowance and Search Report (Search Report in English) dated May 29, 2015; for Korean Pat. App. No. 102124903; 3 pages.
Korean Response and Amendment dated Sep. 25, 2015, to Office Action dated Jul. 29, 2015; For Korean Pat. App. No. 10-2010-7009105; 34 pages.
Letter from $21^{st}$ Century Patent and Law firm dated Sep. 25, 2015; For Korean Pat. App. No. 10-2010-7009105; 1 page.
Notice of Allowance dated Jun. 19, 2015: for U.S. App. No. 13/501,584; 10 pages.
Korean Notice to Submit Response dated Jul. 29, 2015; For Pat. App. No. 10-2010-7009105; 12 pages.
Office Action dated Nov. 8, 2011; for U.S. Appl. No. 12/629,374; 18 pages.
U.S. Office Action Dated Dec. 21, 2010; for U.S. Appl. No. 12/136,347; 25 pages.
Response filed Mar. 18, 2011; to Office Action dated Dec. 21, 2010; for U.S. Appl. No. 12/136,347; 16 pages.
Notice of Allowance dated May 9, 2011; for U.S. Appl. No. 12/136,247; 8 pages.
Corrected Notice of Allowance dated Feb. 18, 2015; for U.S. Appl. No. 14/149,167; 6 pages.
Office Action dated Aug. 26, 2015; for U.S. Appl. No. 14/638,257; 33 pages.
Response filed Jul. 20, 2015; to Office Action dated Feb. 18, 2015; for U.S. Appl. No. 14/147,811; 8 pages.
Response to 312 Amendment dated Feb. 13, 2015; for U.S. Appl. No. 13/177,070; 4 pages.
Response filed Aug. 7, 2014; to Office Action dated May 28, 2014; for U.S. Appl. No. 13/591,570; 11 pages.
Office Action dated Aug. 12, 2014; for U.S. Appl. No. 13/752,904; 19 pages.
Office Action dated Aug. 12, 2014; for U.S. Appl. No. 13/591,564; 28 pages.
Response filed Dec. 10, 2014; to Office Action dated Sep. 15, 2014; for U.S. Appl. No. 13/591,564; 17 pages.
Japanese Office Action (with English Translation) dated Jun. 4, 2014; for Japanese Pat. App. No. 2013-105879; 4 pages.
Letter from Yuasa and Hara dated Jul. 22, 2014; for Japanese Pat. App. No. 2013-105879; 2 pages.
Taiwan Notice of Allowance and Taiwan IPO Search Report dated May 29, 2015; for Taiwan Pat. App. No. 102124903; 3 pages.
Email from Taiwan International Patent & Law Office dated Aug. 4, 2015; for Korean Pat. App. No. 101123288; 2 pages.
Korean Allowance Decision dated Jul. 30, 2015; for Korean Pat. App. No. 101123288; 2 pages.
PCT International Preliminary Report on Patentability and Written Opinion of the ISA dated Jun. 27, 2013; for PCT Pat. App. No. PCT/US2011/062500; 10 pages.
PCT Search Report and Written Opinion of the ISA dated Sep. 4, 2012; for PCT Pat. App. No. PCT/US2012/043275; 9 pages.
PCT Search Report and Written Opinion of the ISA dated Oct. 1, 2012; for PCT Pat. App. No. PCT/US2012/044149; 11 pages.
PCT Search Report and Written Opinion of the ISA dated Feb. 13, 2014; for PCT Pat. App. No. PCT/US2013/053165; 8 pages.
U.S. Appl. No. 12/620,374; Part 1 of 9; 250 pages.
U.S. Appl. No. 12/620,374; Part 2 of 9; 250 pages.
U.S. Appl. No. 12/620,374; Part 3 of 9; 250 pages.
U.S. Appl. No. 12/620,374; Part 4 of 9; 250 pages.
U.S. Appl. No. 12/620,374; Part 5 of 9; 250 pages.
U.S. Appl. No. 12/620,374; Part 6 of 9; 250 pages.
U.S. Appl. No. 12/620,374; Part 7 of 9; 250 pages.
U.S. Appl. No. 12/620,374; Part 8 of 9; 250 pages.
U.S. Appl. No. 12/620,374; Part 9 of 9; 52 pages.
U.S. Appl. No. 12/136,347; Part 1 of 5; 400 pages.
U.S. Appl. No. 12/136,347; Part 2 of 5; 400 pages.
U.S. Appl. No. 12/136,347; Part 3 of 5; 400 pages.
U.S. Appl. No. 12/136,347; Part 4 of 5; 400 pages.
U.S. Appl. No. 12/136,347; Part 5 of 5; 50 pages.
U.S. Appl. No. 12/267,645; Part 1 of 5; 400 pages.
U.S. Appl. No. 12/267,645; Part 2 of 5; 400 pages.
U.S. Appl. No. 12/267,645; Part 3 of 5; 400 pages.
U.S. Appl. No. 12/267,645; Part 4 of 5; 400 pages.

(56) References Cited

OTHER PUBLICATIONS

U.S. Appl. No. 12/267,645; Part 5 of 5; 176 pages.
U.S. Appl. No. 13/428,654; Part 1 of 9; 220 pages.
U.S. Appl. No. 13/428,654; Part 2 of 9; 350 pages.
U.S. Appl. No. 13/428,654; Part 3 of 9; 350 pages.
U.S. Appl. No. 13/428,654; Part 4 of 9; 350 pages.
U.S. Appl. No. 13/428,654; Part 5 of 9; 350 pages.
U.S. Appl. No. 13/428,654; Part 6 of 9; 350 pages.
U.S. Appl. No. 13/428,654; Part 7 of 9; 302 pages.
U.S. Appl. No. 13/428,654; Part 8 of 9; 220 pages.
U.S. Appl. No. 13/428,654; Part 9 of 9; 217 pages.
U.S. Appl. No. 14/149,167; Part 1 of 15; 278 pages.
U.S. Appl. No. 14/149,167; Part 2 of 15; 305 pages.
U.S. Appl. No. 14/149,167; Part 3 of 15; 300 pages.
U.S. Appl. No. 14/149,167; Part 4 of 15; 300 pages.
U.S. Appl. No. 14/149,167; Part 5 of 15; 300 pages.
U.S. Appl. No. 14/149,167; Part 6 of 15; 224 pages.
U.S. Appl. No. 14/149,167; Part 7 of 15; 285 pages.
U.S. Appl. No. 14/149,167; Part 8 of 15; 350 pages.
U.S. Appl. No. 14/149,167; Part 9 of 15; 131 pages.
U.S. Appl. No. 14/149,167; Part 10 of 15; 350 pages.
U.S. Appl. No. 14/149,167; Part 11 of 15; 350 pages.
U.S. Appl. No. 14/149,167; Part 12 of 15; 350 pages.
U.S. Appl. No. 14/149,167; Part 13 of 15; 350 pages.
U.S. Appl. No. 14/149,167; Part 14 of 15; 350 pages.
U.S. Appl. No. 14/149,167; Part 15 of 15; 385 pages.
U.S. Appl. No. 13/177,070; Part 1 of 10; 218 pages.
U.S. Appl. No. 13/177,070; Part 2 of 10; 246 pages.
U.S. Appl. No. 13/177,070; Part 3 of 10; 408 pages.
U.S. Appl. No. 13/177,070; Part 4 of 10; 408 pages.
U.S. Appl. No. 13/177,070; Part 5 of 10; 280 pages.
U.S. Appl. No. 13/177,070; Part 6 of 10; 275 pages.
U.S. Appl. No. 13/177,070; Part 7 of 10; 403 pages.
U.S. Appl. No. 13/177,070; Part 8 of 10; 346 pages.
U.S. Appl. No. 13/177,070; Part 9 of 10; 316 pages.
U.S. Appl. No. 13/177,070; Part 10 of 10; 139 pages.
U.S. Appl. No. 13/591,570; Part 1 of 8; 360 pages.
U.S. Appl. No. 13/591,570; Part 2 of 8; 212 pages.
U.S. Appl. No. 13/591,570; Part 3 of 8; 212 pages.
U.S. Appl. No. 13/591,570; Part 4 of 8; 300 pages.
U.S. Appl. No. 13/591,570; Part 5 of 8; 360289 pages.
U.S. Appl. No. 13/591,570; Part 6 of 8; 300 pages.
U.S. Appl. No. 13/591,570; Part 7 of 8; 300 pages.
U.S. Appl. No. 13/591,570; Part 8 of 8; 298 pages.
Response to Written Opinion filed Sep. 9, 2015 for European Application No. 13750986.5; 14 pages.
Response to Written Opinion filed Sep. 14, 2015 for European Application No. 13748426.7; 22 pages.
Notice of Allowance dated Nov. 9, 2015 corresponding to U.S. Appl. No. 14/147,811; 30 Pages.
Response dated Nov. 19, 2015 to Office Action dated Aug. 26, 2015; for U.S. Appl. No. 14/538,257; 9 pages.
Letter from Taiwan Internationai Patent and Law Office dated Dec. 2, 2015; for Taiwanese Pat. App. No. 101123288; 1 page.
Notice of Allowance dated Dec. 18, 2015; For Pat. App. No. 14/638,257; 16 pages.

\* cited by examiner

ELECTRONIC CIRCUITS AND TECHNIQUES FOR MAINTAINING A CONSISTENT POWER DELIVERED TO A LOAD

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to electronic circuits used to drive a load, for example, a light emitting diode (LED) load.

BACKGROUND OF THE INVENTION

A variety of electronic circuits are used to drive loads and, more particularly, to control electrical current through strings of series connected light-emitting diodes (LEDs), which, in some embodiments, form an LED display, or, more particularly, a backlight for a display, for example, a liquid crystal display (LCD). It is known that individual LEDs have a variation in forward voltage drop from unit to unit. Therefore, the strings of series connected LEDs can have a variation in forward voltage drop.

Strings of series connected LEDs can be coupled to a common DC-DC converter, e.g., a switching regulator, e.g., a boost switching regulator, at one end of the LED strings, The switching regulator can be configured to provide a high enough voltage to supply each of the strings of LEDs. The other end of each of the strings of series connected LEDs can be coupled to a respective current sink, configured to sink a relatively constant current through each of the strings of series connected LEDs.

It will be appreciated that the voltage generated by the common switching regulator must be a high enough voltage to supply the one series connected string of LEDs having the greatest total voltage drop, plus an overhead voltage needed by the respective current sink. In other words, if four series connected strings of LEDs have voltage drops of 30V, 30V, 30V, and 31 volts, and each respective current sink requires at least one volt in order to operate, then the common boost switching regulator must supply at least 32 volts.

While it is possible to provide a fixed voltage switching regulator that can supply enough voltage for all possible series strings of LEDs, such a switching regulator would generate unnecessarily high power dissipation when driving strings of series connected LEDs having less voltage drop. Therefore, in some LED driver circuits, the voltage drops through each of the strings of series connected LEDs are sensed (for example, by a so-called "minimum select circuit," or by a multi-input amplifier) to select a lowest voltage or lowest average voltage appearing at the end of one of the strings of series connected LEDs. The common switching regulator is controlled to generate an output voltage only high enough to drive the series connected led string having the lowest voltage (i.e., the highest voltage drop) or to drive a lowest average voltage to the strings. Arrangements are described, for example, in U.S. Pat. No. 6,822,403, issued Nov. 23, 2004, and in U.S. patent Ser. No. 12/267,645, filed Nov. 10, 2008, and entitled "Electronic Circuits for Driving Series Connected Light Emitting Diode Strings."

It will be understood that a predetermined current can be regulated through each one of the series connected diode strings, and the voltage of the DC-DC converter can be maintained just high enough to drive a worst case one of the diode strings, or to drive a worst case average voltage through the diode strings.

In some applications, it is desirable to dim or to brighten the LED diode strings. In some particular applications, it is desirable to brighten and to dim the LED diode string over a wide dynamic range.

In order to cause a dimming or brightening of the LEDs while still maintaining a desirable lowest voltage from the DC-DC converter (switching regulator), and while still maintaining the predetermined current through the diode strings, the predetermined current through the LEDs can be cycled on and off at a rate fast enough to be undetected by the human eye. When the current through the LEDs is on, the current equals the desirable predetermined current, and when the current through the LEDs is off, the current can be zero or some current less than the predetermined current.

When the current through the load is switched off, it is desirable to switch off the DC-DC converter, and when the current through the load is switched on, it is desirable to switch on the DC-DC converter. If the DC-DC converter is left on when the current through the load is switched off, the DC-DC converter would lack feedback control and the output voltage of the DC-DC converter could move to a different voltage, which is undesirable.

Since, as described above, the common switching regulator is controlled to generate an output voltage only high enough to drive the series connected LED string having the lowest voltage, any voltage dip in the output voltage of the switching regulator can cause a corresponding dip in current supplied to one or more of the series connected LED strings, resulting in an undesirable flicker. The voltage dip can occur in the output voltage of the switching regulator due to a variety of causes. For example, a dip in the regulated output voltage of the switching regulator can occur due to a dip in the input voltage supplied to the switching regulator. In this case, the regulated output voltage would not recover for some period of time, until the switching regulator recovers, and the flicker would occur.

In order to achieve the wide dynamic range of brightness required by some applications, the on time of the current and the on time of the DC-DC converter must be able to be very short. For reasons described below, DC-DC converters are unable to achieve very short on times when switched on and off.

A DC-DC converter is often used in a feedback arrangement, in which a current or voltage at a load is sensed and the sensed current or voltage is used in a feedback loop to control the output voltage of the DC-DC converter. In a feedback loop, there is often so-called "compensation," often in the form of a capacitor or filter, in order to slow the response time of the feedback loop in order to maintain stability.

Furthermore, many types of DC-DC converters, and switching regulators in particular, use an inductor to store energy during operation. The DC-DC converter, and the inductor in particular, require a finite time to reach steady state operation, and to reach a steady state output voltage.

In view of the above, it should be recognized that, when a short on time is desired to achieve a wide brightness dynamic range, the DC-DC converter may not behave properly in short duty cycle operation and fluctuations of the output voltage of the DC-DC converter may result. Thus, for a very short duty cycles, fluctuations in the output voltage of the DC-DC converter can also result in flicker.

It would be desirable to provide a circuit and technique that can achieve a wide dynamic range of power provided to a load by a DC-DC converter in a feedback loop arrangement, while reducing any fluctuation of power delivered to the load (e.g., flicker) that may result from fluctuation of a regulated voltage supplied by the DC-DC converter.

SUMMARY OF THE INVENTION

The present invention provides circuits and techniques circuits and techniques that can achieve a wide dynamic range of power provided to a load by a DC-DC converter in a feedback loop arrangement, while reducing any fluctuation of power delivered to the load (e.g., flicker) that may result from fluctuation of a regulated voltage supplied by the DC-DC converter.

In accordance with one aspect of the present invention, an electronic circuit to provide an adjustable average current through a load includes a PWM input node coupled to receive a pulse width modulated (PWM) signal having first and second states with respective adjustable time durations. The electronic circuit also includes a condition detection circuit configured to identify a condition of the electronic circuit and to generate a condition signal indicative of the condition. The electronic circuit also includes a current extension circuit comprising an input node, a control node, and an output node. The input node of the current extension circuit is coupled receive the condition signal and the control node of the current extension circuit is coupled to the PWM input node. The current extension circuit is configured to generate, at the output node of the current extension circuit, an extended PWM signal having a first state and a second state. The first state of the extended PWM signal longer in time than the first state of the PWM signal by an amount related to a value or a state of the condition signal.

In some embodiments, the electronic circuit further includes a load connection node configured to couple to the load, and a current regulator circuit comprising an input node, an output node, and a current enable node. A selected one of the input node or the output node of the current regulator circuit is coupled to the load connection node. The current enable node is coupled to receive the extended PWM signal and the current regulator circuit is configured to pass a predetermined current from the input node to the output node. The predetermined current is passed or not passed depending upon the first or the second state, respectively, of the extended PWM signal.

In accordance with another aspect of the present invention, a method of generating an adjustable average current through a load with an electronic circuit includes receiving a pulse width modulated (PWM) signal having first and second states with respective adjustable time durations. The method further includes detecting a condition of the electronic circuit and generating a condition signal related to the condition. The method further includes generating an extended PWM signal having first and second states with respective time durations in accordance with the condition signal. The first state of the extended PWM signal is longer than the first state of the PWM. The method further includes coupling a current regulator to the load. The current regulator is coupled to receive the extended PWM signal and the current regulator circuit is configured to pass a predetermined current from the input node to the output node. The predetermined current is passed or not passed depending upon the first or the second state, respectively, of the extended PWM signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "boost switching regulator" is used to describe a known type of switching regulator that provides an output voltage higher than an input voltage to the boost switching regulator. While a certain particular circuit topology of boost switching regulator is shown herein, it should be understood that boost switching regulators have a variety of circuit configurations. As used herein, the term "buck switching regulator" is used to describe a known type of switching regulator that provides an output voltage lower than an input voltage to the buck switching regulator. It should be understood that there are still other forms of switching regulators other than a boost switching regulator and other than a buck switching regulator, and this invention is not limited to any one type.

DC-DC voltage converters (or simply DC-DC converters) are described herein. The described DC-DC converters can be any form of DC-DC converter, including, but not limited to, the above-described boost and buck switching regulators.

As used herein, the term "current regulator" is used to describe a circuit or a circuit component that can regulate a current passing through the circuit or circuit component to a predetermined, i.e., regulated, current. A current regulator can be a "current sink," which can input a regulated current, or a "current source," which can output a regulated current. A current regulator has a "current node" at which a current is output in the case of a current source, or at which a current is input in the case of a current sink.

Figure 1:
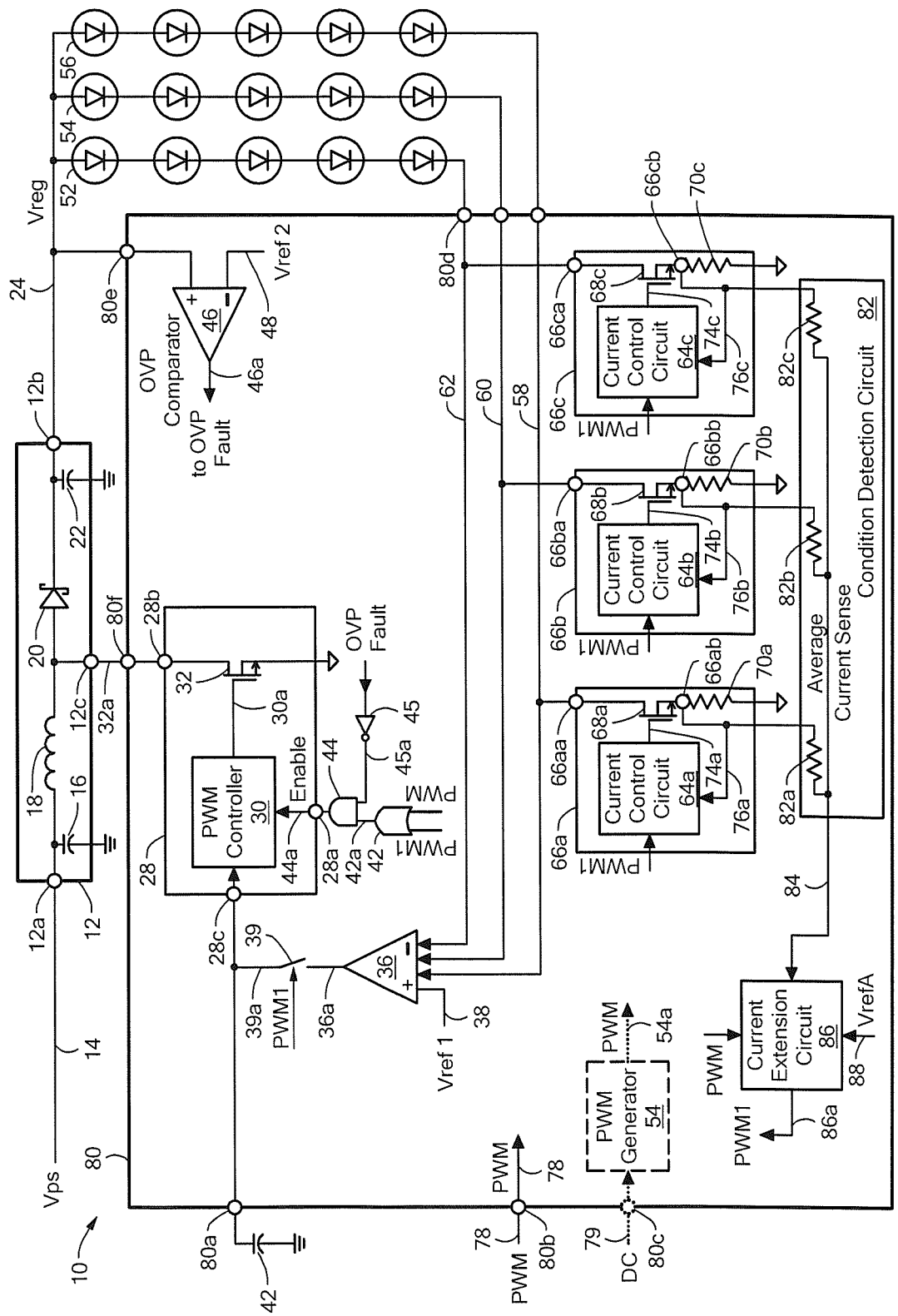
FIG. 1 is a block diagram showing an exemplary circuit to drive a load, the circuit having a DC-DC voltage converter, in the form of a switching regulator, and current regulators coupled on opposite sides of series coupled light emitting diode (LED) strings, and for which a power to the load (the LEDs) can be pulsed, the circuit also having a current extension circuit to extend on times of an extended PWM signal applied to turn on and off the current regulators.

Referring to FIG. 1, an exemplary electronic circuit 10 includes a controllable DC-DC converter 12 coupled to one or more loads, for example, series connected diode strings 52, 54, 56, which, in some arrangements, are series connected light emitting diode (LED) strings as may form an LED display or a backlight for a display, for example, a liquid crystal display (LCD). As described above, in some arrangements, the controllable DC-DC converter 12 is a switching regulator. The series connected LED strings 52, 54, 56 are coupled to respective current regulators 66a, 66b, 66c, here shown to be current sinks. The current regulators 66a, 66b, 66c have respective voltage sense nodes 66aa, 66ba, 66ca, respective current sense nodes 66ab, 66bb, 66cb, and respective current control circuits 64a, 64b, 64c.

Operation of the current regulators 66a, 66b, 66c is described more fully below in conjunction with FIGS. 3 and 4. Let it suffice here to say that the current regulators 66a, 66b, 66c maintain a predetermined voltage at the current sense nodes 66ab, 66bb, 66cb, resulting in predetermined currents flowing through resistors 70a, 70b, 70c and through the current regulators 66a, 66b, 66c.

At the same time, the switching regulator 12 is controlled in a feedback arrangements to maintain sufficient voltage (as little as possible) at the voltage sense nodes 66aa, 66ba, 66ca to allow the current regulators 66a, 66b, 66c to operate.

Since the series connected LED strings 52, 54, 56, can each generate a different voltage drop, the voltages appearing at the voltage sense nodes 66aa, 66ba, 66ca can be different. It will also be recognized that at least a predetermined minimum voltage must be present at each of the voltage sense nodes 66aa, 66ba, 66ca in order for each of the current regulators 66a, 66b, 66c to function properly, i.e., to sink the desired (predetermined) current for which they are designed. In normal operation, it is desirable to maintain voltages at the voltages sense nodes 66aa, 66ba, 66ca as low as possible to conserve power, but high enough to achieve proper operation.

A multi-input error amplifier 36 is coupled to receive voltage signals 58, 60, 62 corresponding to voltages appearing at the voltage sense nodes 66aa, 66ba, 66ca, respectively, at one or more inverting input nodes. The multi-input error amplifier 36 is also coupled to receive a reference voltage signal 38, for example, 0.5 volts, at a non-inverting input node. The multi-input error amplifier 36 is configured to generate an error signal 36a, which is related to an opposite of an arithmetic mean of the voltage signals 58, 60, 62. In some particular arrangements, the multi-input error amplifier 36 has inputs comprised of metal oxide semiconductor (MOS) transistors. In some arrangements, the error amplifier 36 is a transconductance amplifier, which provides a current-type output.

A switch 39 is coupled to receive the error signal 36a and configured to generate a switched error signal 39a under control of an extended pulse width modulated (PWM) signal 86a, described more fully below.

The circuit 10 can include a capacitor 42 coupled to receive the switched error signal 39a. In one particular arrangement, the capacitor 42 has a value of about one hundred picofarads. The capacitor 42 can provide a loop filter and can have a value selected to stabilize a feedback control loop.

A DC-DC converter controller 28 is coupled to receive the switched error signal 39a at an error node 28c.

An average current to the load, which is related to an average power to the load, can be detected by way of resistors 82a, 82b, 82c arranged in a condition detection circuit 82 to provide an average current sense signal 84 having a value (e.g., an analog value) related to an average current delivered to all of the loads (e.g., series coupled LED strings 52, 54, 56). While the resistors 82a, 82b, 82c are shown to be coupled to each one of the current regulators 66a, 66b, 66c, in other embodiments, resistors may be coupled to only one or only some of the current regulators 66a, 66b, 66c.

The resistors 82a, 82b, 82c are selected to have relatively large values, for example, 10 kOhms, so as not to affect operation of the current regulators 66a, 66b, 66c.

Average current indicated by the average current sense signal 84 is related to a duty cycle of the extended PWM signal 86a described more fully below. Short duty cycles result in low power to the load (e.g., dim LED strings) and high duty cycles result in high power to the load (e.g., bright LED strings).

A so-called "current extension circuit" 86 is coupled to receive the average current sense signal 84, coupled to receive a PWM signal 78 (or alternatively, a PWM signal 54a), coupled to receive a reference signal 88, for example, a reference signal, VrefA, (also described below in conjunction with FIG. 3), and configured to generate the extended PWM signal 86a. The current extension circuit 86 is described more fully below in conjunction with FIG. 5. Let it suffice here to say that, particularly for very short duty cycles (e.g., short periods of the high state) of the PWM signal 78, the extended PWM signal 86a has a longer high state period than the PWM signal 78.

In operation, in some embodiments, particularly for short duty cycles of the PWM signal 78, the current extension circuit 86 can provide the extended PWM signal 86a, PWM1, to extend the on times of the current regulators 66a, 66b, 66c beyond that which they would achieve if controlled by the PWM signal 78. Operation of the current extension circuit 86 is described more fully in conjunction with FIGS. 5, 6, and 6A.

A gate, for example, an OR gate 42, can be coupled to receive the extended PWM signal 86a, coupled to receive the PWM signal 78, and configured to generate a control signal 42a.

Another gate, for example, an AND gate 44, can be coupled to receive the control signal 42a, coupled to receive a circuit error signal, for example, an overvoltage (OVP) signal 45a, and configured to generate a control signal 44a.

At an enable node 28a, the DC-DC converter controller 28 can be turned on and off by the control signal 44a.

The DC-DC converter controller 28 can include a PWM controller 30 configured to generate a DC-DC converter PWM signal 30a, which is a different PWM signal than the PWM signal 78 described above. The DC-DC converter PWM signal 30a can have a higher frequency (e.g., 100 KHz) than the PWM signal 78 (e.g., 200 Hz).

A switch, for example, a FET switch 32, can be coupled to receive the DC-DC converter PWM signal 30a at its gate, the FET configured to provide a switching control signal 32a to the DC-DC converter 12. Operation of the DC-DC converter 12, here shown to be a boost switching regulator, in conjunction with the switching control signal 32a, will be understood. Each time the switch 32 closes, current flows through an inductor 18, storing energy, and each time the switch 32 opens, the energy is released to a capacitor 22. If the closure time of the switch 32 is too short, energy cannot build in the inductor 18 to a steady state condition and the switching regulator 12 does not function properly.

The controllable DC-DC converter 12 is also coupled to receive a power supply voltage, Vps, at an input node 12a and to generate a regulated output voltage 24 at an output node 14a in response to the error signal 36a, and in response to the switching control signal 32a. In some arrangements, the controllable DC-DC converter 12 is a boost switching regulator and the controllable DC-DC converter 12 is coupled to receive the power supply voltage, Vps, at the input node 12a and to generate a relatively higher regulated output voltage 24 at the output node 12b.

With this arrangement, the controllable DC-DC converter 12 is controlled by an arithmetic mean of the voltage signals 58, 60, 62. Thus, an arithmetic mean of the voltage signals 58, 60, 62 that would be too low to provide proper operation of an associated one of the current regulators 66a, 66b, 66c will result in an increase in the error signal 36a, tending to raise the output voltage 24 of the controllable DC-DC converter 12. Thus, the DC-DC converter 12 is controlled in a feedback loop arrangement.

It should be appreciated that the regulated output voltage 24 has a particular desired value. Specifically, the particular desired value of the regulated output voltage 24 is that which achieves a high enough voltage at all of the current regulators 66a, 66b, 66c so that they can all operate properly to regulate current as desired. In addition, the particular desired value of the regulated output voltage 24 is that which is as low as possible so that the one or more of the current regulators that receive the lowest voltage(s) (i.e., the greatest voltage drop across the associated series connected LED strings 52, 54, 56) have just enough voltage to properly operate. With this particular desired value of the regulated output voltage 24, a low power is expended in the current regulators 66a, 66b, 66c resulting in high power efficiency while properly illuminating the LEDs.

In some particular arrangements, the desired value of regulated voltage 24 can include a voltage margin (e.g., one volt). In other words, in some arrangements, the particular desired value of the regulated output voltage 24 is that which is as low as possible so that the one or more of the current regulators that receive the lowest voltage(s) have just enough voltage to properly operate, plus the voltage margin. Still, an acceptably low power consumption can result.

The above described error signal 36a, which is the arithmetic mean of the voltage signals 58, 60, 62, approximately achieves the particular desired value of the regulated output voltage 24.

Certain elements of the circuit 10 can be within a single integrated circuit. For example, in some arrangements, circuit 80 is within an integrated circuit and other components are outside of the integrated circuit.

In some alternate arrangements, the multi-input error amplifier 32 is replaced by a multi-input comparator, which either has hysteresis, or which is periodically clocked at which time it makes a comparison.

The above-described PWM signal 78 can be received at a PWM node 80b of the integrated circuit 80. In some alternate embodiments, in place of the PWM signal 78, another signal, for example, a DC signal 79, can be received at a control node 80c, in which case, an optional PWM generator 54 can be coupled to receive the DC signal and can be configured to generate a PWM signal 54a. The PWM signal 54a can have a duty cycle related to a value of the DC signal 79. Either the PWM signal 78 or the PWM signal 54a can be used as the PWM signal indicated in other parts of the circuit 10.

In operation, in order to control a brightness of the LED strings 52, 54, 56, or, more generally, a power delivered to a load, a duty cycle of the PWM signal 78 (or 54a) can be varied, which varies a duty cycle of the extended PWM signal 86a. When the extended PWM signal 86a is high, the circuit 10 operates in a closed loop arrangement, i.e., the switch 39 is closed the current control circuits 64a, 64b, 64c are enabled, and the PWM controller 28 is enabled, causing the switching control signal 32a to switch. When the extended PWM signal 86a is high, the voltage signals 58, 60, 62 are controlled and the currents passing through the current regulators 66a, 66b, 66c are controlled.

When the extended PWM signal 86a is low, the circuit 10 is shut down in several regards. Currents passing through the current regulators 66a, 66b, 66c are stopped by way of the extended PWM signal 86a received by the current regulators 66a, 66b, 66c. The switch 39 is opened, causing the capacitor 42 to hold its voltage. The PWM controller 28 is disabled, causing the switching control signal 32a to stop switching, and the DC-DC converter 12 to stop converting. When stopped, voltage from the DC-DC converter 12, i.e., the voltage 24, is held on the capacitor 22, but tends to droop with time.

It will be understood that, when the PWM 78 signal goes from low to high for only a short period (i.e., the PWM signal 78 has only a short duty cycle), if the switching regulator were controlled by the PWM signal 78, the switching regulator 12 may not have sufficient time to achieve steady state operation. Therefore, when the PWM signal 78 has a short duty cycle, the current extension circuit 86 can not only extend on times of the current regulators, 66a, 66b, 66c, but can also operate to enable the PWM controller 30 for a time longer than a time that would be achieved by the high state of the PWM signal 78. Generation of the extended PWM signal 86a is described below in conjunction with FIG. 5.

In some alternate embodiments, the PWM controller is controlled by the PWM signal 78 and not by the extended PWM signal.

Figure 2:
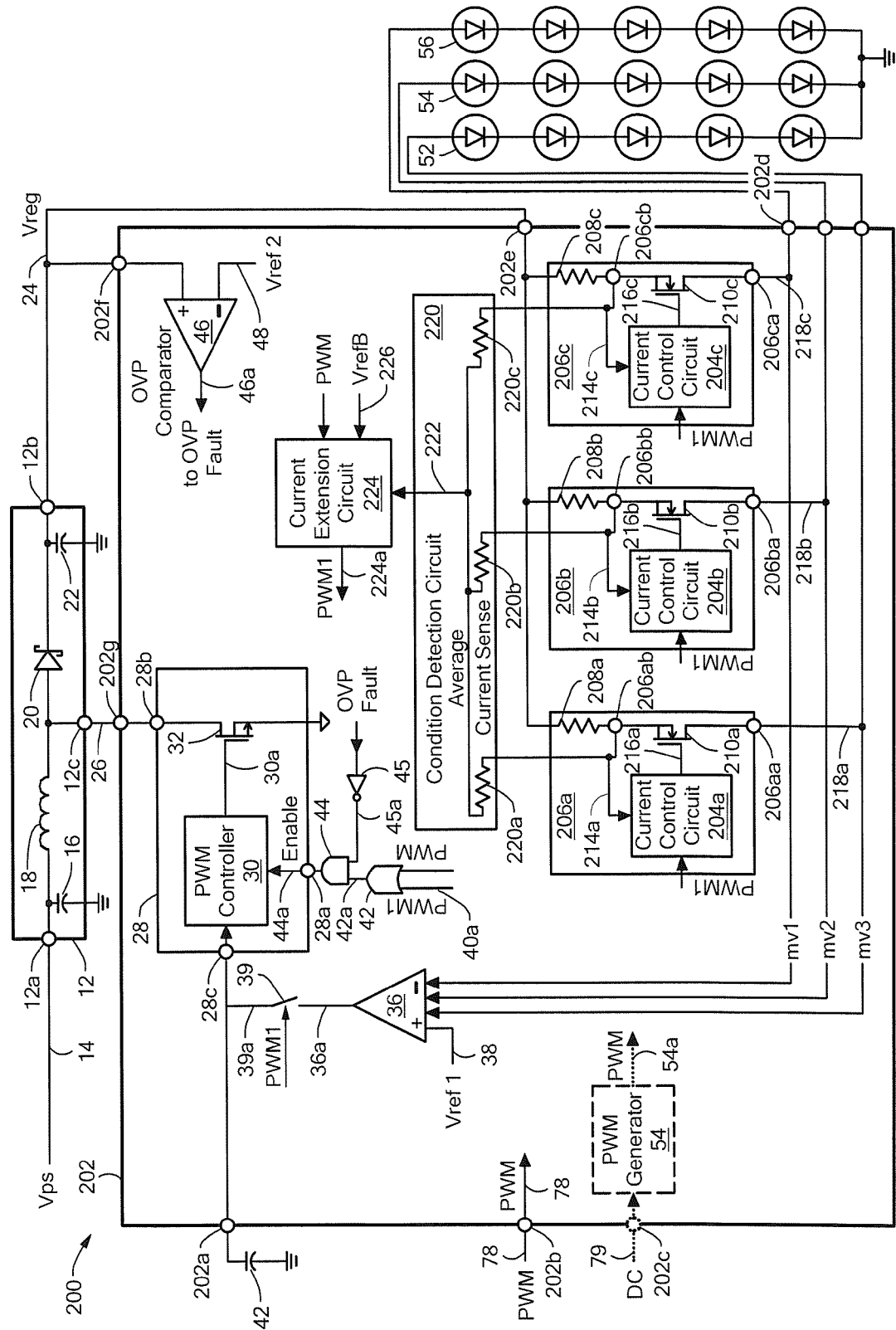
FIG. 2 is a block diagram showing another exemplary circuit to drive a load, the circuit having a DC-DC voltage converter, in the form of a switching regulator, and current regulators coupled on opposite sides of series coupled light emitting diode (LED) strings, and for which a power to the load (the LEDs) can be pulsed, the circuit also having a current extension circuit to extend on times of an extended PWM signal applied to turn on and off the current regulators.

Referring now to FIG. 2, in which like elements of FIG. 1 are shown having like reference designations, a circuit 200 is similar to the circuit 10 of FIG. 1. Current regulators 206a, 206b, 206c, are similar to the current regulators 66a, 66b, 66c of FIG. 1, however, the current regulators 206a, 206b, 206c are coupled to the bottom (cathode) ends of the series connected LED strings 52, 54, 56, respectively, instead of to the top (anode) ends of the series connected LED strings 52, 54, 56, respectively. In these embodiments, an input node 202e is coupled to receive the regulated output voltage 24, and output nodes, of which a node 202d is but one example, are coupled to the anode ends of the series connected LED strings 52, 54,

56, respectively. The inverting inputs of the error amplifier 36 are coupled to voltage sense node 206aa, 206ba, 206ca.

The current regulators 206a, 206b, 206c have the voltage sense nodes 206aa, 206ba, 206ca, respectively, current sense nodes 206ab, 206bb, 206cb, respectively, and current control circuits 204a, 204b, 204c, respectively.

A current extension circuit 224 is the same as or similar to the current extension circuit 86 of FIG. 1.

Operation of the circuit 200, including brightness control, is similar to operation of the circuit 10 described above in conjunction with FIG. 1.

Figure 3:
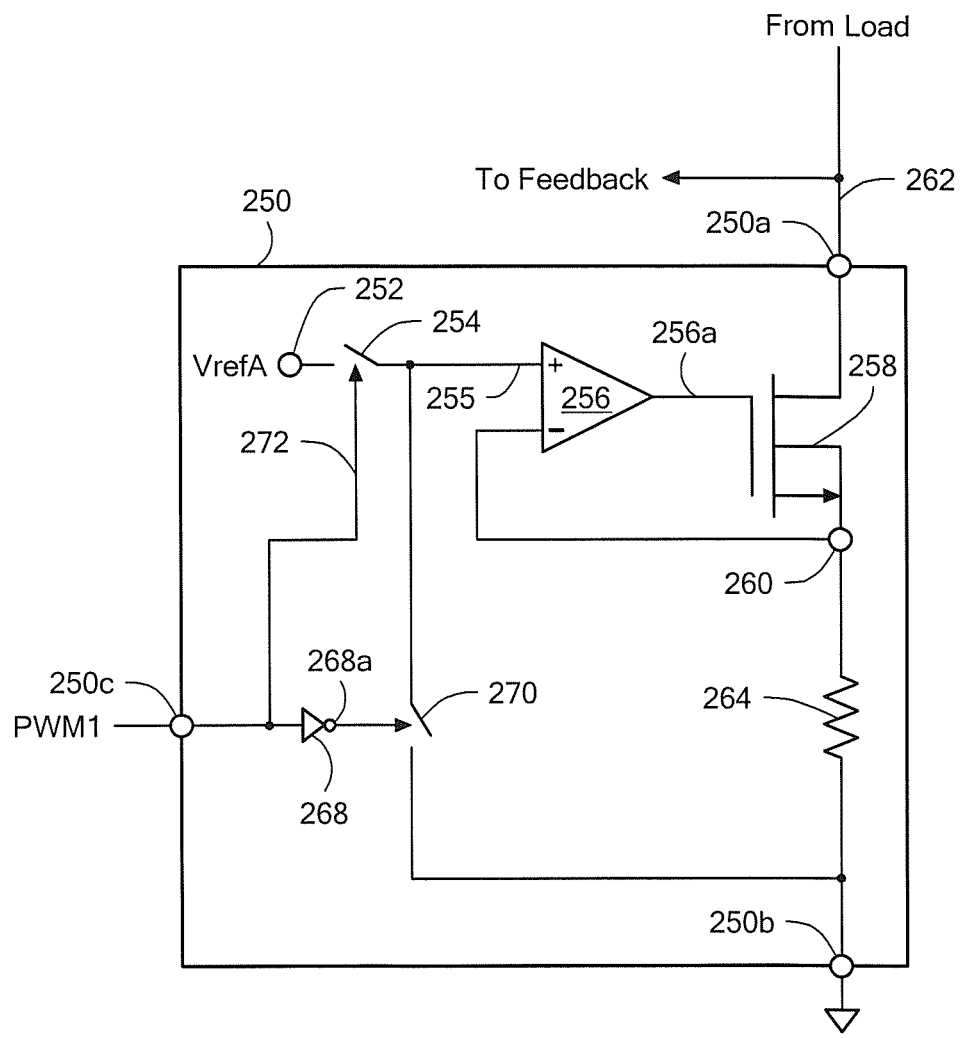
FIG. 3 is a block diagram showing an exemplary current regulator that can be used in the circuit of FIG. 1.

Referring now to FIG. 3, an exemplary current regulator circuit 250 can be the same as or similar to the current regulator circuits 66a, 66b, 66c of FIG. 1. The current regulator circuit 250 can include a node 250c coupled to receive a PWM signal 272, which can be the same as or similar to one of the PWM signals 78, 54a of FIG. 1.

A voltage sense node 250a can be the same as or similar to the voltage sense nodes 66aa, 66ba, 66ca of FIG. 1. A current sense node 260 can be the same as or similar to the current sense nodes 66ab, 66bb, 66cb of FIG. 1. A FET 258 can be the same as or similar to the FETs 68a, 68b, 68c of FIG. 1. A resistor 264 can be the same as or similar to the resistors 70a, 70b, 70c of FIG. 1.

The current regulator circuit 250 can include an amplifier 256 having an inverting input coupled to the current sense node 260, an output coupled to a gate of the FET 258, and a non-inverting input coupled, at some times, to receive a reference voltage, VrefA, through a switch 254, and coupled, at other times, to receive another reference voltage, for example, ground, through a switch 270. The switch 254 is coupled to receive the PWM signal 272 at its control input, and the switch 270 is coupled to receive an inverted PWM signal 268a at its control input via an inverter 268. Thus, the switches 254, 256 operate in opposition.

In operation, in response to a high state of the PWM signal 272, the switch 254 is closed and the switch 270 is open. In this state, the current regulator circuit 250 is enabled in a feedback arrangement and acts to maintain the reference voltage 252 as a signal 266 on the resistor 264, thus controlling a current through the resistor 264 and through the FET 258.

In response to a low state of the PWM signal 272, the switch 254 is open and the switch 270 is closed. In this state, an output signal 256a of the amplifier 256 is forced low, turning off the FET 258 (an N channel FET), and stopping current from flowing through the FET 258 and through the resistor 264. Thus, the current regulator circuit 250 can be enabled and disabled in accordance with states of the PWM signal 272.

Figure 4:
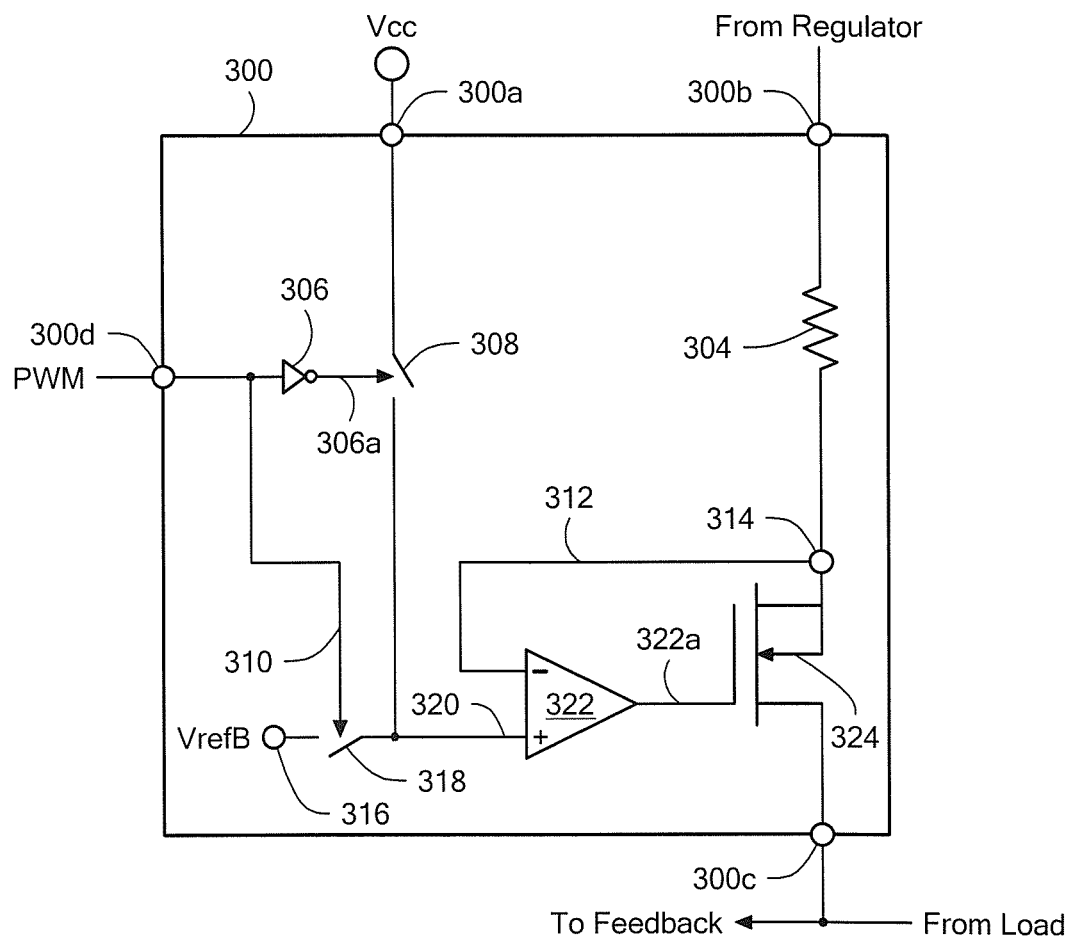
FIG. 4 is a block diagram showing an exemplary current regulator that can be used in the circuit of FIG. 2.

Referring now to FIG. 4, an exemplary current regulator circuit 300 can be the same as or similar to the current regulator circuits 206a, 206b, 206c of FIG. 2. The current regulator circuit 300 can include a node 300d coupled to receive a PWM signal 310, which can be the same as or similar to one of the PWM signals 78, 54a of FIG. 2.

A voltage sense node 300c can be the same as or similar to the voltage sense nodes 206aa, 206ba, 206ca of FIG. 2. A current sense node 314 can be the same as or similar to the current sense nodes 206ab, 206bb, 206cb of FIG. 2. A FET 324 can be the same as or similar to the FETs 210a, 210b, 210c of FIG. 2. A resistor 304 can be the same as or similar to the resistors 208a, 208b, 208c of FIG. 2.

The current regulator circuit 300 can include an amplifier 322 having an inverting input coupled to the current sense node 314, an output coupled to a gate of the FET 324, and a non-inverting input coupled, at some times, to receive a reference voltage, VrefB, through a switch 318, and coupled, at other times, to receive another reference voltage, for example, Vcc, through a switch 308. The switch 318 is coupled to receive the PWM signal 310 at its control input, and the switch 308 is coupled to receive an inverted PWM signal 306a at its control input via an inverter 306. Thus, the switches 318, 308 operate in opposition.

In operation, in response to a high state of the PWM signal 310, the switch 318 is closed and the switch 308 is open. In this state, the current regulator circuit 300 is enabled in a feedback arrangement and acts to maintain the reference voltage 316 as a signal 312 on the resistor 304, thus controlling a current through the resistor 304 and through the FET 324.

In response to a low state of the PWM signal 310, the switch 318 is open and the switch 308 is closed. In this state, an output signal 322a of the amplifier 322 is forced high, turning off the FET 324 (a P channel FET), and stopping current from flowing through the FET 324 and through the resistor 304. Thus, the current regulator circuit 300 can be enabled and disabled in accordance with states of the PWM signal 310.

Figure 5:
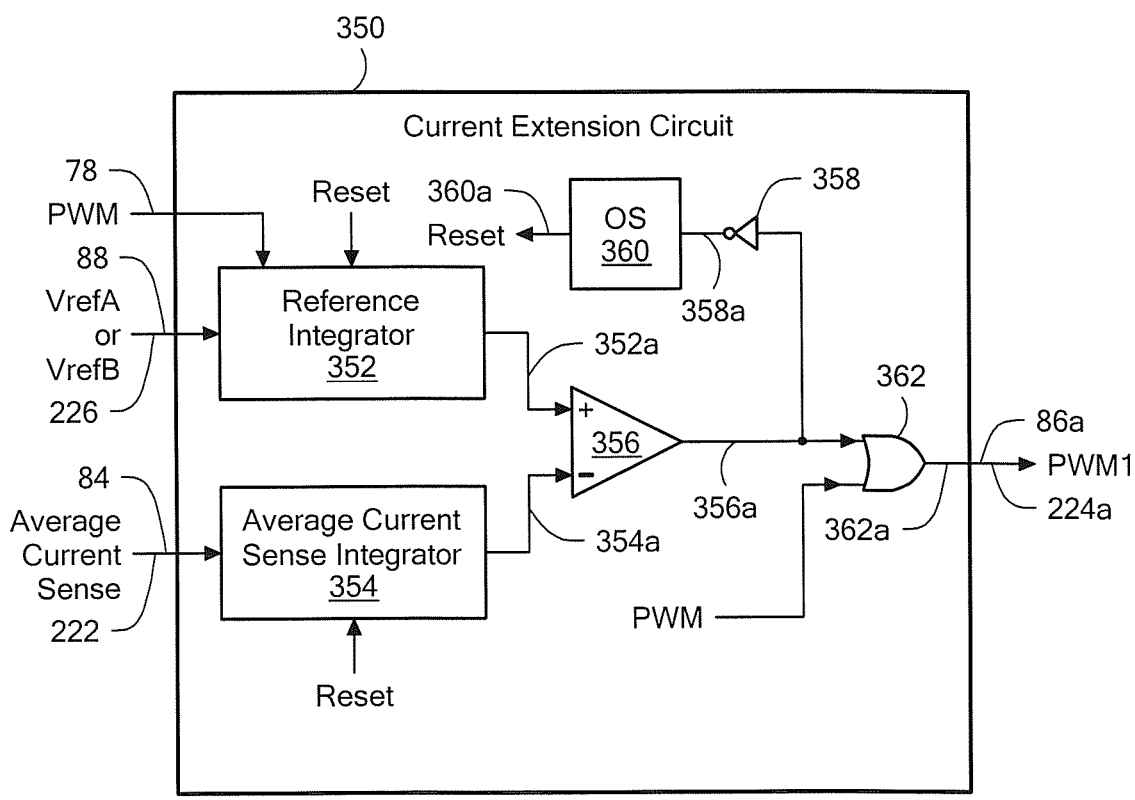
FIG. 5 is a block diagram of an exemplary current extension circuit that can be used as the current extension circuits of FIGS. 1 and 2.

Referring now to FIG. 5, a current extension circuit 350 can be the same as or similar to the current extension circuits 86, 224 of FIG. 1 or 2. The current extension circuit 350 can be coupled to receive a signal having a value related to a value of an average current sense signal, which can be the same as or similar to the average current sense signals 84, 222 of FIG. 1 or 2. The current extension circuit 350 can also be coupled to receive a reference voltage signal, VrefA or VrefB, which can be the same as or similar to the voltage reference signals 88, 226 of FIG. 1 or 2. The current extension circuit 350 can also be coupled to receive a PWM signal, which can be the same as or similar to the PWM signal 78 of FIGS. 1 and 2, or the PWM signal 54a of FIGS. 1 and 2. The current extension circuit 350 is configured to generate an extended PWM signal 356a, PWM1, which can be the same as or similar to the extended PWM signals 86a, 224a of FIG. 1 or 2.

The current extension circuit 350 can include a reference integrator 352 coupled to receive the reference voltage signal, VrefA or VrefB, which can be the same as or similar to the voltage reference signals 88, 226 of FIG. 1 or 2, and configured to generate a first integrated signal 352a. The current extension circuit 350 can also include an average current sense integrator 354 coupled to receive a signal having a value related to a value of the adjustable average current through the load, which can be the same as or similar to the average current sense signals 84, 222 of FIG. 1 or 2, and configured to generate a second integrated signal 354a. The current extension circuit 350 can also include a comparator 356 coupled to receive the first and second integrated signals 352a, 354a, respectively, and configured to generate a comparison signal 356a. An OR gate 362 can be coupled to receive the comparison signal 356a at one input and coupled to receive the PWM signal at a second input. The OR gate is configured to generate an extended PWM signal 362a. The extended PWM signal 362a can be the same as or similar to the extended PWM signals 86a, 224a of FIG. 1 or 2.

The current extension circuit 350 can also include a reset circuit coupled to receive the comparison signal 356a as an input to an inverter 358. An output signal 358a from the inverter 358 is received by a one-shot circuit 360 configured to generate a pulse output signal 360a as a reset signal. The reset signal 360a is received by both the reference integrator 352 and by the average current sense integrator 354.

Operation of the current extension circuit 350 is described more fully below in conjunction with FIG. 6.

Figure 6:
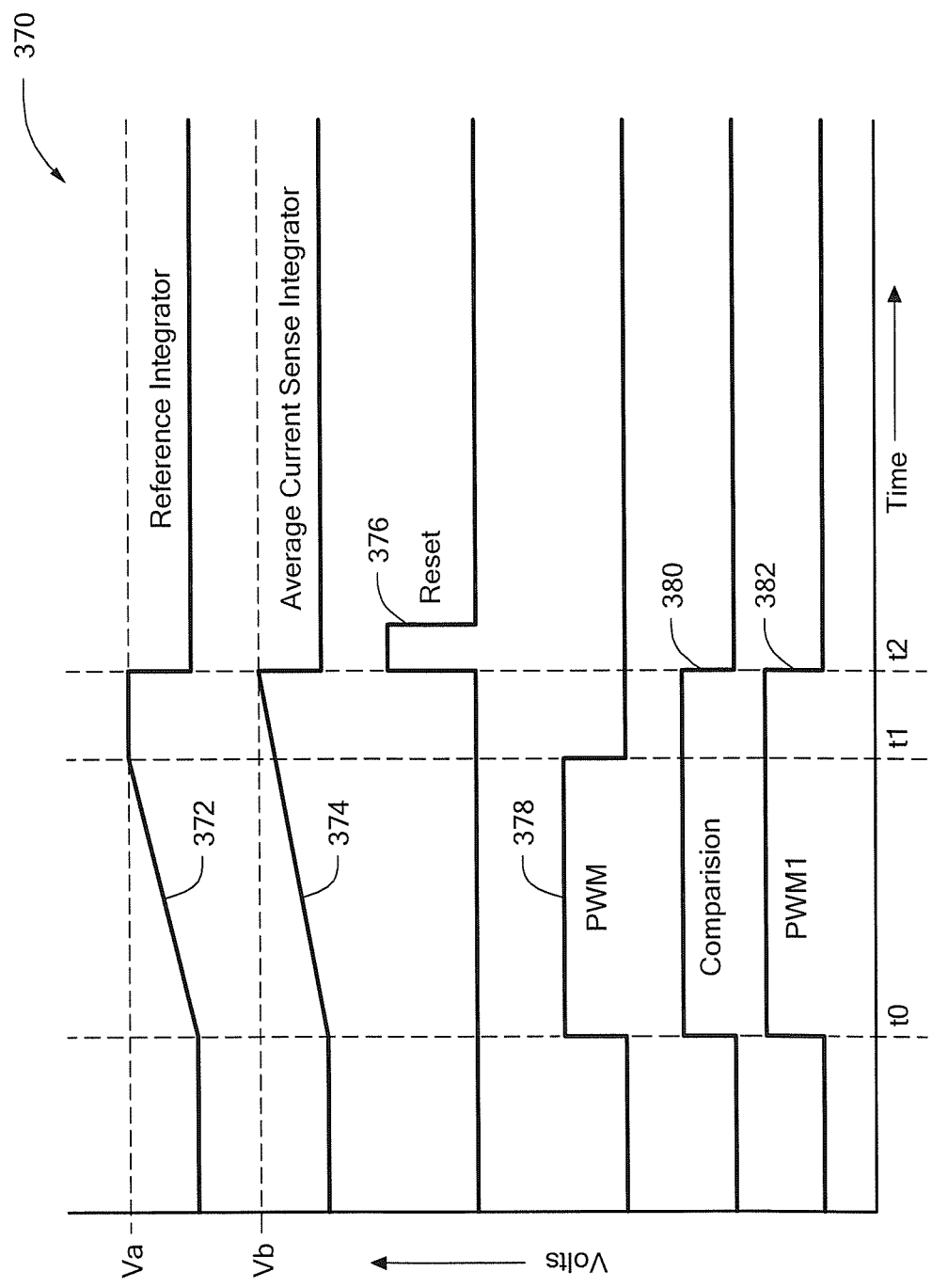
FIG. 6 is a graph showing operation of the current extension circuit of FIG. 5.

Referring now to FIG. 6, a graph 370 has a horizontal axis with a scale in units of time in arbitrary units. The graph also has a vertical axis with a scale in units of volts in arbitrary units. A series of signals is shown in the graph of FIG. 6. Each signal is shown having its own separable range of values on the vertical axis.

A reference integrator signal 372 is indicative of the first integrated signal 352a generated by the reference integrator 352 of FIG. 5. A current sense integrator signal 374 is indicative of the second integrated signal 354a generated by the average current sense integrator 354 of FIG. 5. A reset signal 376 is indicative of the reset signal 360a of FIG. 5. A PWM signal 378, PWM, is indicative of the PWM signal 78 received by the reference integrator 352 of FIG. 5. A comparison signal 380 is indicative of the comparison signal 356a of FIG. 5. An extended PWM signal 382, PWM1, is indicative of the extended PWM signal 362a of FIG. 5.

The reference integrator signal 372 is indicative of an integration that occurs between times t0 and t1, corresponding to start and stop times of a high state of the PWM signal 380. The current sense integrator signal 374 is indicative of an integration that begins at the time t0, but which ends a later time, t2. The later time, t2 occurs when the average current sense integrator signal 374 achieves a value, Vb, greater than or equal to a value, Va, achieved by the reference integrator signal 372, as identified by the comparator 356 of FIG. 5, and is represented by the comparison signal 380.

It will be appreciated that, if the average current sense integrator signal 374 rises more rapidly than the reference integrator signal 372, then the high state of the comparison signal 380 can be shorter than the high state of the PWM signal 378. However, the high state of the extended PWM signal 382 cannot be shorter than the high state of the PWM signal 378 due to operation of the OR gate 362 of FIG. 5.

Figure 6A:
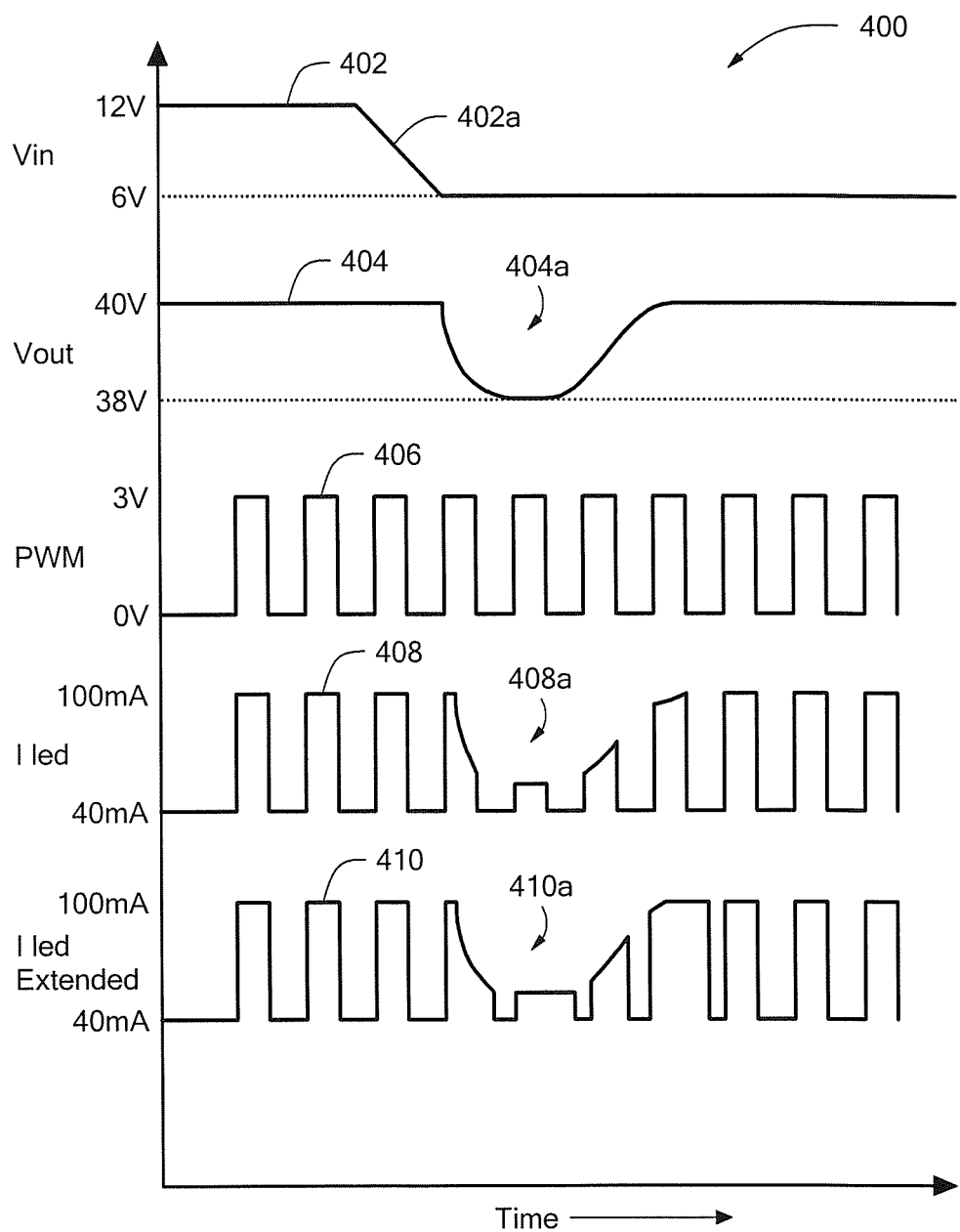
FIG. 6A is a graph showing operation of the current extension circuit of FIG. 5 when used in the circuits of FIG. 1 or 2.

Referring now to FIG. 6A, a graph 400 has a horizontal axis with a scale in units of time in arbitrary units. The graph also has a vertical axis with a scale in units of volts and current in volts and in milliamps. A series of signals is shown in the graph of FIG. 6A. Each signal is shown having its own separable range of values on the vertical axis.

A signal 402 is representative of a power supply signal, for example the power supply signal 14 of FIGS. 1 and 2. The power supply signal 402 is shown to have a region 402a indicative of a drop in the power supply voltage, which is undesirable. While but one drop is shown, there can be many drops from time to time.

A signal 404 is representative of a regulated voltage provided by a DC-DC converter, for example the regulated voltage 24 provided by the switching regulator 12 of FIGS. 1 and 2. The regulated voltage signal 404 is shown to have a region 404a with the dip in voltage. The dip in voltage is a result of the drop in power supply voltage of the signal 402. As described above the switching regulator cannot respond immediately to a drop in the power supply voltage, which results in a dip in the output regulated voltage of the switching regulator. As described above, this is very undesirable for reasons that will become apparent below.

A signal 406 is representative of the PWM signal 78 of FIGS. 1 and 2. As described above, the PWM signal has a variable duty cycle in order to control a brightness of the LEDS 52, 54, 56 of FIGS. 1 and 2 by way of turning on an off the current regulators 66a, 66b, 66c. Only one duty cycle is shown.

A signal 408 is representative of a current passing through one of the current regulators 66a, 66b, 66c of FIG. 1 or the current regulators 206a, 206b, 206c of FIG. 2, if the current regulators were controlled by the PWM signal 406 instead of by the extended PWM signal 86a, 224a of FIGS. 1 and 2, respectively. The signal 408 has a disturbed region 408a resulting from the drop in the regulated voltage signal 404. It will be understood that, during the disturbed region 408a, the LEDS 52, 54, 56 will dim by a perceptible amount, which is unacceptable.

A signal 410 is representative of a current passing through one of the current regulators 66a, 66b, 66c of FIG. 1 or the current regulators 206a, 206b, 206c of FIG. 2 when the current regulators 6 are controlled instead by the extended PWM signal 86a, 224a of FIGS. 1 and 2, respectively. The signal 410, like the signal 408, also has a disturbed region 410a. However, during the disturbed region 410a, on times of the current regulators are extended in time resulting in wider pulses of current passing through the current regulators. Thus, even though the currents are reduced in magnitude passing through the current regulators within the disturbed region 410a, extra power is delivered to the load, i.e. the LEDS 52, 54, 56, due to the extended on times of the currents passing through the current regulators. This results in approximately the same power passing through the LEDS 52, 54, 56 during the disturbed region 410a as passes through the LEDS at other times. Therefore, the drop in power supply voltage represented by the signal 402 and resulting drop in the regulated voltage represented by the signal 404 does not cause a flicker of the brightness of the LEDS 52, 54, 56.

Preceding circuits and techniques use a detection of the average current passing through one or more of the current regulators as a stimulus to extend in time the currents passing through the current regulators. The average current is sensed by the condition detection circuits 82, 220 of FIGS. 1 and 2, respectively. Below, it will be shown that other conditions of the circuits can be detected, other than the average current, and other condition signals can be generated, which can be used as stimuli to extend on times of the currents passing through the current regulators.

In many embodiments shown below, the condition signal is a binary digital condition, unlike the condition signals 84, 222 described above, which are variable analog condition signals, resulting in a variable time extension of the extended PWM signals 86a, 224a.

Figure 7:
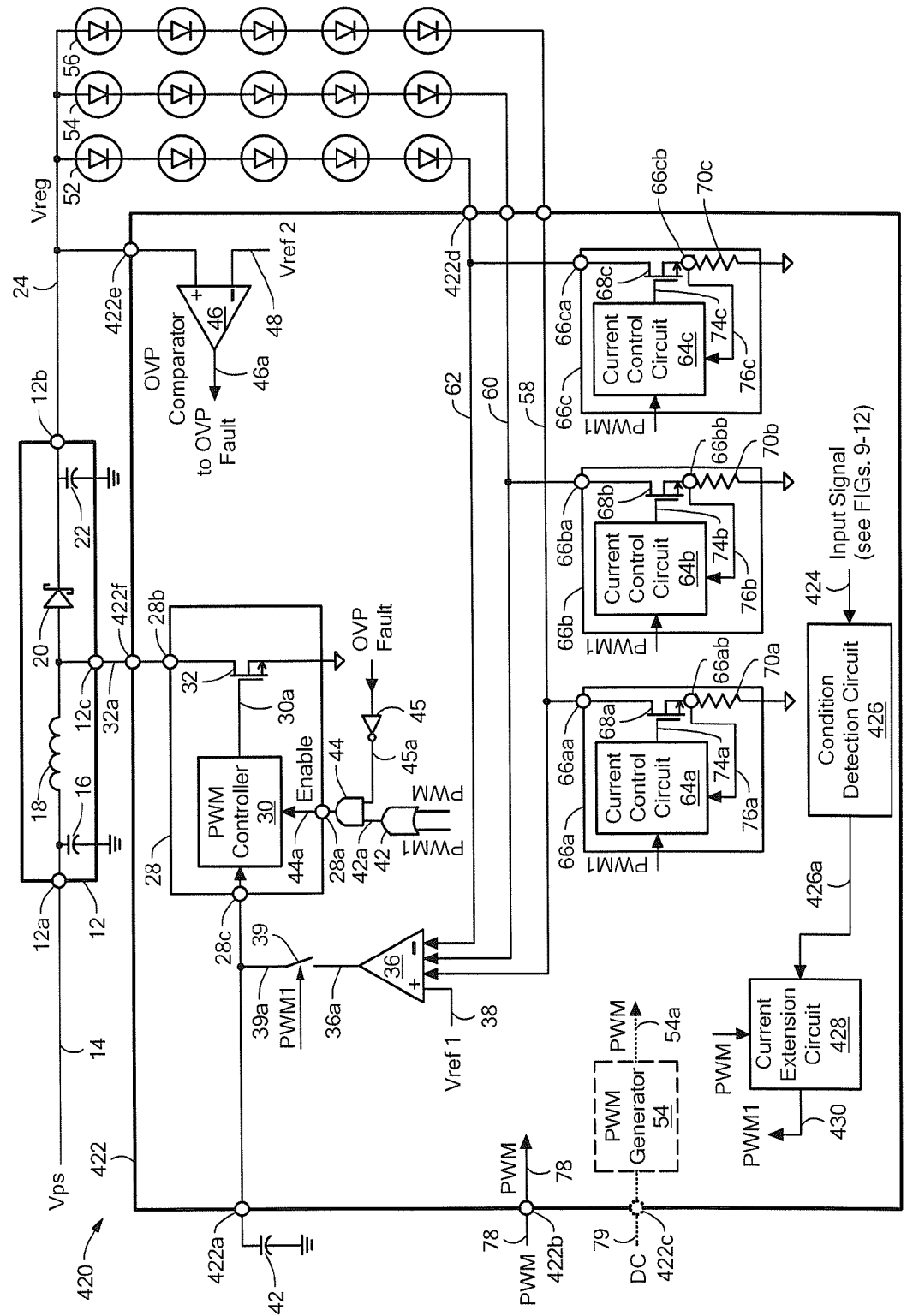
FIG. 7 is a block diagram showing another exemplary circuit to drive a load, the circuit having a DC-DC voltage converter, in the form of a switching regulator, and current regulators coupled on opposite sides of series coupled light emitting diode (LED) strings, and for which a power to the load (the LEDs) can be pulsed, the circuit also having a generalized condition detection circuit and a generalized current extension circuit, the current extension circuit, response to the condition detection circuit, to extend on times of an extended PWM signal applied to turn on and off the current regulators.

Referring now to FIG. 7, in which like elements of FIGS. 1 and 2 are shown having like reference designations, a circuit 420 includes a circuit 422, in which a condition detection circuit 426 and a current extension circuit 428 are more generally shown. The condition detection circuit 426 is coupled to receive one of a variety of input signals 424 described in conjunction with FIGS. 9-12 below. The condition detection circuit 426 is configured to generate a condition signal 426a. A current extension circuit 428 is coupled to receive the condition signal, coupled to receive the PWM signal 78, and configured to generate an extended PWM signal 430.

Figure 8:
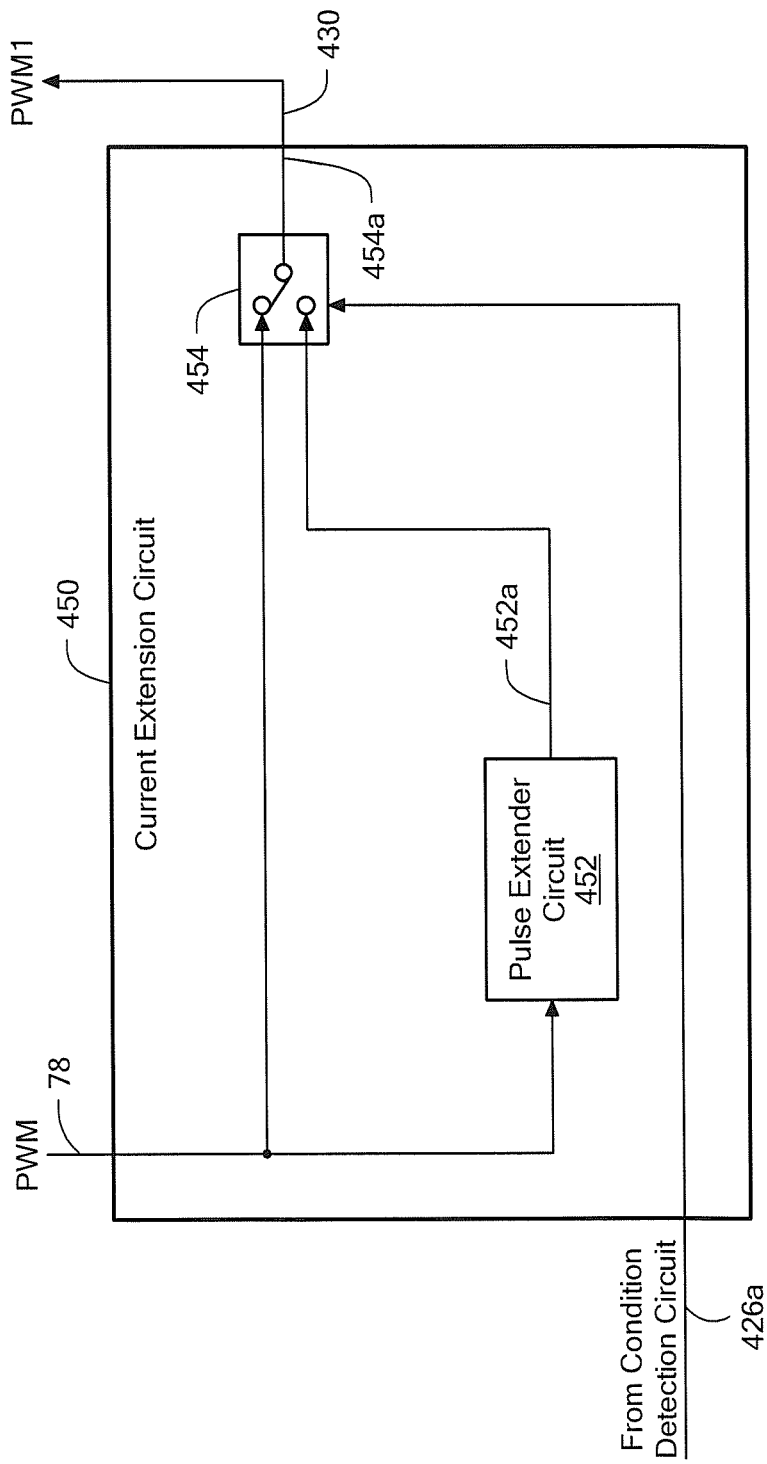
FIG. 8 is a block diagram of an exemplary current extension circuit that can be used to this is the current extension circuit of FIG. 7.

Referring now to FIG. 8, in which like elements of FIG. 7 are shown having like reference designations, a current extension circuit 450 can be the same as or similar to the current extension circuit 428 of FIG. 7. The current extension circuit 450 can be coupled to receive the PWM signal 78 and coupled to receive the condition signal 426a.

The current extension circuit 450 can include a pulse extender circuit 452 coupled to receive the PWM signal 78. The pulse extender circuit is configured to generate an extended signal 452a, which is like the PWM signal 78 but having a state, for example, a first or high state, extended in time from that of the PWM signal 78.

The current extension circuit 450 can also include a single pole double throw switch 454 coupled to receive the PWM signal 78 and also coupled to receive the extended signal

452a. The switch 454 is configured to generate a signal 454a, which is the same as or similar to the extended PWM signal 430 of FIG. 7.

The switch 454 is controlled by the condition signal 426a, which can be a two state binary signal.

Pulse extender circuits are known and can be made with a variety of configurations. For example, a pulse extender circuit can be made with a current source feeding into a capacitor to extend one of the edges, for example, the falling edge, of an input pulse. For another example, a pulse extender can be formed as a Layman's pulse extender. For yet another example a pulse extender can be formed using a ripple counter. These and other techniques will be understood by those of ordinary skill in the art.

In some embodiments, the pulse extender circuit 452 can generated the extended signal 452a having a state, for example, a high state, that is longer in time than a corresponding state of the PWM signal 78 by a predetermined amount of time. In some embodiments, the predetermined amount of time is about two microseconds. However, the predetermined time can be longer or shorter than two microseconds.

In operation, the condition signal 426a, in accordance with two binary states, provides either the PWM signal 78 or the extended signal 452a as the extended PWM signal 430 by way of the switch 454.

FIGS. 9-12 show a variety of circuits that can be used to form condition detection circuits and associated condition signals that can be used as the condition detection circuit 426 and condition signal 426a of FIG. 7.

Figure 9:
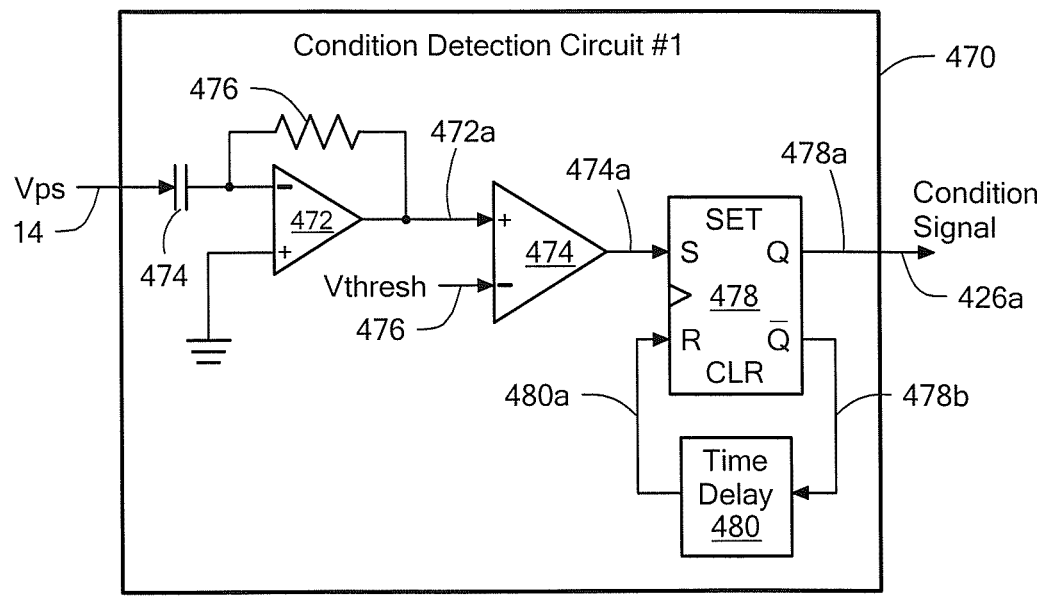
FIG. 9 is a block diagram of an exemplary condition detection circuit that can be used as the condition detection circuit of FIG. 7.

Referring now to FIG. 9, in which like elements of FIGS. 7 and 8 are shown having like reference designations, a condition detection circuit 470 can be coupled to receive and act upon the power supply voltage 14 of FIG. 7, differentiating the power supply voltage 14, and therefore, acting upon a rate of change of the power supply voltage 14. The condition detection circuit 470 can be the same as or similar to the condition detection circuit 426 of FIG. 7.

The condition detection circuit 470 can include a capacitor 474 and a resistor 476 coupled around an operational amplifier 472 to form a differentiator. The operational amplifier 472 is coupled to receive the power supply signal 14 and configured to generate a differentiated signal 472a. A comparator 474 is coupled to receive the differentiated signal 472a at one input and coupled to receive a voltage threshold signal 476 at another input. The comparator 474 is configured to generate a comparison signal 474a. The comparison signal 474a has two states, a first state, e.g., a high state, indicative of a rate of change of the power supply voltage 14 being above the threshold value 476 and a second different state indicative of the rate of change of the power supply voltage 14 being below the threshold value 476.

A flip-flop 478 is coupled to receive the comparison signal 474a at a set input. The flip-flop 478 is configured to generate an output signal 478a at a Q output. The flip-flop 478 is also configured to generate another output signal 478b at an inverted Q output. A time delay module 480 is coupled to receive the signal 478b and configured to generate a delayed signal 480a received by the flip-flop 478 at a reset input.

The time delay module 480 provides a time delay selected to result in the condition signal 426a taking on a first state, for example, a high state, for a predetermined amount of time. The predetermined amount of time can be, for example, two microseconds.

The signal 478a generated by the flip-flop 478 can be the same as or similar to the condition signal 426a of FIGS. 7 and 8.

Using the condition signal 478a of FIG. 9 as the input condition signal 426a of FIG. 8, it will be understood that the signal 454a is extended for the predetermined amount of time when the condition signal 426a is indicative of the power supply voltage 14 having a high rate of change, and the signal 454a is not extended, i.e., it is the same as the PWM signal 78, when the power supply voltage 14 does not have a high rate of change.

Other arrangements are possible that do not have the flip-flop 478 or the time delay module 480. With these embodiments, there is no predetermined amount of time, and the signal 454a of FIG. 8 is extended when the condition signal 426a is indicative of the power supply voltage 14 having a high rate of change, and the signal 454a is not extended, i.e., it is the same as the PWM signal 78, when the power supply voltage 14 does not have a high rate of change.

Figure 10:
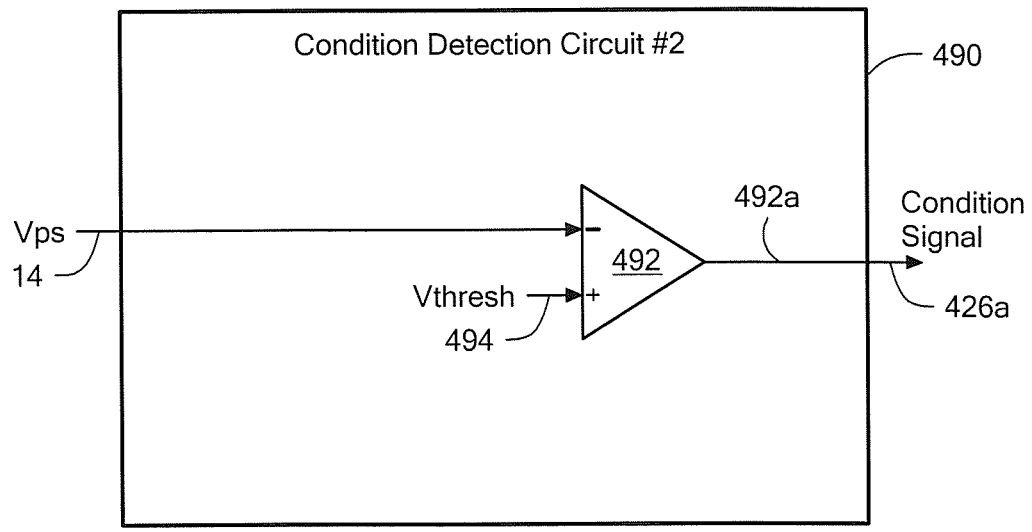
FIG. 10 is a block diagram of another exemplary condition detection circuit that can be used as the condition detection circuit of FIG. 7.
Figure 11:
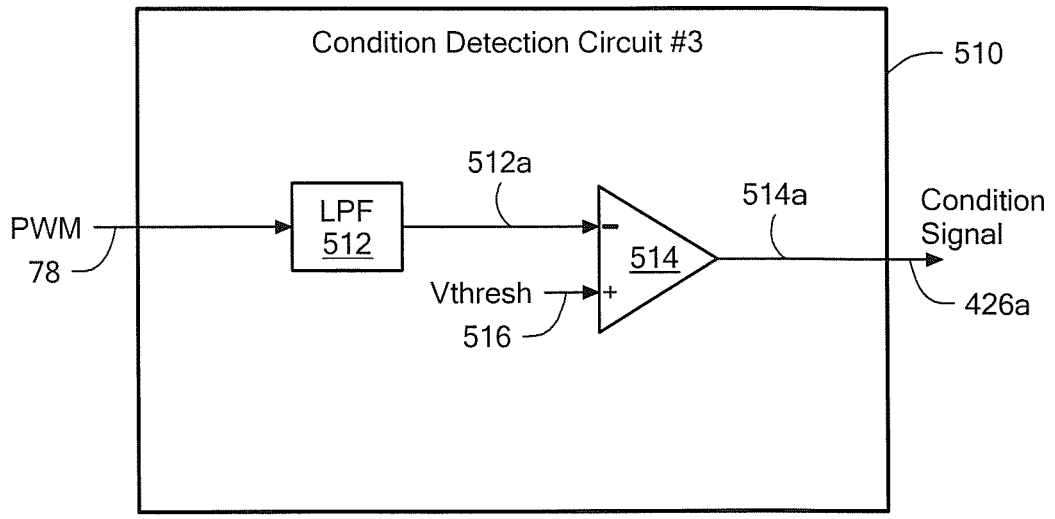
FIG. 11 is a block diagram of another exemplary condition detection circuit that can be used as the condition detection circuit of FIG. 7.
Figure 12:
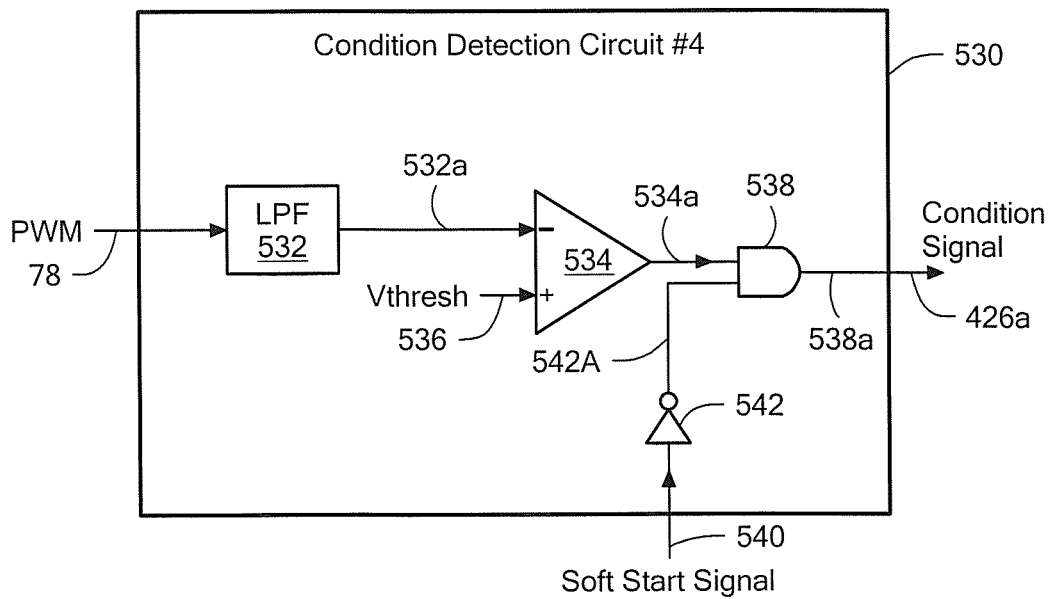
FIG. 12 is a block diagram of another exemplary condition detection circuit that can be used as the condition detection circuit of FIG. 7.

Other condition detection circuits are shown in FIGS. 10-12 below, each without a flip-flop or time delay circuit. In other embodiments, each of these circuits can have a flip-flop and time delay circuit to generate a selected state of an output signal only for a predetermined amount of time.

Referring now to FIG. 10, in which like elements of FIGS. 7 and 8 are shown having like reference designations, a condition detection circuit 490 can be coupled to receive and act upon the power supply voltage 14 of FIG. 7, threshold detecting the power supply voltage 14, and therefore, acting upon a value of the power supply voltage 14. The condition detection circuit 490 can be the same as or similar to the condition detection circuit 426 of FIG. 7.

The condition detection circuit 490 can include a comparator 492 coupled to receive the power supply voltage 14 at one input and coupled to receive a voltage threshold signal 494 at another input. The comparator 492 is configured to generate a comparison signal 492a. The comparison signal 492a has two states, a first state, e.g., a high state, indicative of a value of the power supply voltage 14 being below the threshold value 494 and a second different state indicative of the value of the power supply voltage 14 being above the threshold value 494.

Using the condition signal 492a of FIG. 10 as the input condition signal 426a of FIG. 8, it will be understood that the signal 454a is extended when the condition signal 426a is indicative of the power supply voltage 14 being below a predetermined value, and the signal 454a is not extended, i.e., it is the same as the PWM signal 78, when the power supply voltage 14 is above the predetermined value.

Referring now to FIG. 11, in which like elements of FIGS. 7 and 8 are shown having like reference designations, a condition detection circuit 510 can be coupled to receive and act upon the PWM signal 78 of FIG. 7, detecting when the PWM signal 78 has a duty cycle below a threshold value. The condition detection circuit 510 can be the same as or similar to the condition detection circuit 426 of FIG. 7.

The condition detection circuit 510 can include a low pass filter 512 coupled to receive the PWM signal 78 and configured to generate a filtered signal 512a. The condition detection circuit 510 can include a comparator 514 coupled to receive the filtered signal 512a at one input and coupled to receive a voltage threshold signal 516 at another input. The comparator 514 is configured to generate a comparison signal 514a. The comparison signal 514a has two states, a first state, e.g., a high state, indicative of a value of the duty cycle of the PWM signal 78 being below the threshold value 516 and a second different state indicative of the value of the duty cycle of the PWM signal being above the threshold value 516.

Using the condition signal 514a of FIG. 11 as the input condition signal 426a of FIG. 8, it will be understood that the signal 454a of FIG. 8 is extended when the condition signal 426a is indicative of the duty cycle of the PWM signal 78 being below a predetermined value, and the signal 454a is not extended, i.e., it is the same as the PWM signal 78, when the duty cycle of the PWM signal 78 is above the predetermined value.

Referring now to FIG. 12, in which like elements of FIGS. 7 and 8 are shown having like reference designations, a condition detection circuit 530 can be coupled to receive and act upon the PWM signal 78 of FIG. 7, detecting when the PWM signal 78 has a duty cycle below a threshold value. A so-called "soft start" signal 544 is also used. The condition detection circuit 530 can be the same as or similar to the condition detection circuit 426 of FIG. 7.

The soft start signal is a signal generated when the circuit 420 of FIG. 7 is first powered on. The soft start signal has a first state, e.g., a high state, for a predetermined period of time following the time that power is applied to the circuit 420, and a second different state thereafter. In some embodiments, the first state time period is about five milliseconds.

In some embodiments, rather than having an open loop fixed time period, the soft start signal 540 is provided in a closed loop arrangement having a variable time period. For example, in some embodiments, at power on, the LEDs 52, 54, 56 (FIGS. 1 and 2) are monitored by other circuits (not shown) while the currents through the current regulators are set to a highest current condition (or alternatively, a lower current condition), and the soft start signal 504 has the first state until the LEDs 52, 54, 56 achieve or approach their proper closed loop regulation voltage at associated voltage sense nodes.

The condition detection circuit 530 can include a low pass filter 532 coupled to receive the PWM signal 78 and configured to generate a filtered signal 532a. The condition detection circuit 530 can include a comparator 534 coupled to receive the filtered signal 532a at one input and coupled to receive a voltage threshold signal 536 at another input. The comparator 534 is configured to generate a comparison signal 534a. The comparison signal 534a has two states, a first state, e.g., a high state, indicative of a value of the duty cycle of the PWM signal 78 being below the threshold value 516 and a second different state indicative of the value of the duty cycle of the PWM signal being above the threshold value 516.

The soft start signal can be received by an inverter 546a, configured to generate an inverted soft start signal 546a A gate, for example, an AND gate, is coupled to receive the comparison signal 534a at one input and coupled to receive the inverted soft start signal at another input. The AND gate is configured to generate a condition signal 538a.

Using the condition signal 538a of FIG. 11 as the input condition signal 426a of FIG. 8, it will be understood that the signal 454a of FIG. 8 is extended when the condition signal 426a of FIG. is indicative of the duty cycle of the PWM signal 78 being below a predetermined value and when the soft start signal is low (after a soft start period), and the signal 454a is not extended, i.e., it is the same as the PWM signal 78, when the duty cycle of the PWM signal 78 is above the predetermined value or when the soft start signal is high (during the soft start period).

The condition detection circuit of FIGS. 9-12 result in the extended PWM signal being generated to have the extended state (compared to the PWM signal 78) for a predetermined time. In other circuits (not shown), the extended PWM signal is always generated to have the extended state. For these circuits, the condition signal is essentially continuous (i.e., static), since the condition that causes the extended state is continuous.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

The invention claimed is:

1. An electronic circuit to provide an adjustable average current through a load, the electronic circuit comprising:
a PWM input node coupled to receive a pulse width modulated (PWM) signal having first and second states with respective adjustable time durations;
a condition detection circuit configured to identify a condition of the electronic circuit and to generate a condition signal indicative of the condition;
a current extension circuit comprising an input node, a control node, and an output node, the input node of the current extension circuit coupled receive the condition signal, the control node of the current extension circuit coupled to the PWM input node, wherein the current extension circuit is configured to generate, at the output node of the current extension circuit, an extended PWM signal having a first state and a second state, the first state of the extended PWM signal longer in time than the first state of the PWM signal by an amount related to a value or a state of the condition signal;
a switching regulator control node; and
a switching regulator controller having an input node, an output node, and an enable node, the output node of the switching regulator controller coupled to the switching regulator control node, the input node of the switching regulator controller coupled to receive a feedback voltage related to the average current through the load, and the enable node of the switching regulator controller coupled to receive the extended PWM signal, wherein the switching regulator controller does or does not generate a switching signal at the output node of the switching regulator controller depending upon the first or the second state, respectively, of the extended PWM signal.

2. The electronic circuit of claim 1, wherein the longer time of the first state of the extended PWM signal is longer by a determined time amount determined in relation to a value of the condition signal.

3. The electronic circuit of claim 1, wherein the longer time of the first state of the extended PWM signal is longer by a predetermined time when the condition signal has a first state and not longer by the predetermined time when the condition signal has a second different state.

4. The electronic circuit of claim 1, further comprising:
a load connection node configured to couple to the load; and
a current regulator circuit comprising an input node, an output node, and a current enable node, the current regulator circuit coupled to the load connection node, the current enable node coupled to receive the extended PWM signal, the current regulator circuit configured to pass a predetermined current from the input node to the output node, wherein the predetermined current is passed or not passed depending upon the first or the second state, respectively, of the extended PWM signal.

5. The electronic circuit of claim 4, wherein a selected one of the input node or the output node of the current regulator circuit is coupled to the load connection node.

6. The electronic circuit of claim 4, wherein the input node of the current regulator circuit is coupled to the load connection node.

7. The electronic circuit of claim 1, wherein the load comprises a series coupled string of light emitting diodes.

8. The electronic circuit of claim 1, wherein the condition detection circuit comprises at least one of: an average current detection circuit configured to generate the condition signal having a value related to the average current through the load; a dv/dt detection circuit configured to generate the condition signal as a two state signal having the first state resulting from a rate of change of a power supply voltage being above a rate of change threshold; a voltage level detection circuit configured to generate the condition signal as a two state signal having the first state resulting from a value of the power supply voltage being below a power supply voltage threshold; a static circuit configured to generate the condition signal as a static signal having a static value; a short duty cycle detection circuit configured to generate the condition signal as a two state signal having the first state resulting from a duty cycle of the PWM signal being below a duty cycle threshold; or a soft start short duty cycle detection circuit configured to generate the condition signal as a two state signal having the first state resulting from a duty cycle of the PWM signal being below the duty cycle threshold in combination with a state of a soft start signal, wherein the soft start signal comprises a two state signal having a state delayed from a startup of the electronic circuit.

9. The electronic circuit of claim 8, further comprising: a load connection node configured to couple to the load; and a current regulator circuit comprising an input node, an output node, and a current enable node, the current regulator circuit coupled to the load connection node, the current enable node coupled to receive the extended PWM signal, the current regulator circuit configured to pass a predetermined current from the input node to the output node, wherein the predetermined current is passed or not passed depending upon the first or the second state, respectively, of the extended PWM signal.

10. The electronic circuit of claim 9, wherein a selected one of the input node or the output node of the current regulator circuit is coupled to the load connection node.

11. The electronic circuit of claim 9, wherein the input node of the current regulator circuit is coupled to the load connection node.

12. The electronic circuit of claim 1, wherein the condition detection circuit comprises:
an average current detection circuit configured to generate the condition signal having a value related to the average current through the load.

13. The electronic circuit of claim 1, wherein the condition detection circuit comprises: a dv/dt detection circuit configured to generate the condition signal as a two state signal having the first state resulting from a rate of change of a power supply voltage being above a rate of change threshold.

14. The electronic circuit of claim 1, wherein the condition detection circuit comprises: a voltage level detection circuit configured to generate the condition signal as a two state signal having the first state resulting from a value of a power supply voltage being below a power supply voltage threshold.

15. The electronic circuit of claim 1, wherein the condition detection circuit comprises: a static circuit configured to generate the condition signal as a static signal having a static value.

16. The electronic circuit of claim 1, wherein the condition detection circuit comprises: a short duty cycle detection circuit configured to generate the condition signal as a two state signal having the first state resulting from a duty cycle of the PWM signal being below a duty cycle threshold.

17. The electronic circuit of claim 1, wherein the condition detection circuit comprises: a soft start short duty cycle detection circuit configured to generate the condition signal as a two state signal having the first state resulting from a duty cycle of the PWM signal being below a duty cycle threshold in combination with a state of a soft start signal, wherein the soft start signal comprises a two state signal having a state delayed from a startup of the electronic circuit.

18. The electronic circuit of claim 1, wherein the current extension circuit comprises:
a reference integrator coupled to receive a reference voltage and configured to generate a first integrated signal;
an average current sense integrator coupled to receive a signal having a value related to a value of the adjustable average current through the load and configured to generate a second integrated signal; and
a comparator coupled to receive the first and second integrated signals and configured to generate the extended PWM signal in accordance with a comparison of the first and second integrated signals.

19. The electronic circuit of claim 1, wherein the current extension circuit comprises: a pulse extender circuit coupled to receive the PWM signal, and configured to generate the extended PWM signal; and a switch circuit coupled to receive the PWM signal, coupled to receive the extended PWM signal, coupled to receive the condition signal and configured to generate an output signed, wherein the output signal from the switch circuit is a selected one of the PWM signal or the extended PWM signal selected in accordance with a state of the condition signal.

20. The electronic circuit of claim 1, wherein the switching regulator control, node is configured to couple to a switching regulator.

21. A method of generating art adjustable average current through a load with an electronic circuit, the method comprising: receiving a pulse width modulated (PWM) signal having first and second states with respective adjustable time durations; detecting a condition of the electronic circuit; generating a condition signal related to the condition; generating an extended PWM signal having first and second states with respective time durations in accordance with the condition signal, wherein the first state of the extended PWM signal is longer than the first state of the PWM; providing a load connection node; coupling a current regulator circuit to the load connection node the current regulator circuit coupled to receive the extended PWM signal, the current regulator circuit comprising an input node, an output node, and a current enable node, wherein the current regulator circuit is configured to pass a predetermined current from the input node to the output node, wherein the predetermined current is passed or not passed depending upon the first or the second state, respectively, of the extended PWM signal; providing a switching regulator control node; and with a switching regulator controller having an input node, an output node, and an enable node, the output node of the switching regulator controller coupled to the switching regulator control node, the input node of the switching regulator controller coupled to receive a feedback voltage related to the average current through the load, and the enable node of the switching regulator controller coupled to receive that extended PWM signal, generating or not generating a switching signal at the output node of the switching regulator controller depending upon the first or the second state, respectively, of the extended PWM signal.

22. The method of claim 21, wherein the load comprises a series coupled string of light emitting diodes.

23. The method of claim 21, wherein the detecting the condition comprises: detecting a value of the average current through the load, wherein the condition, signal has a value related to the value of ice average current.

24. The method of claim 21, wherein the detecting the condition comprises: detecting a rate of change of a power supply voltage being above a rate of change threshold, wherein the condition signal comprises a two state signal having the first state resulting from the rate of change of the power supply voltage being above the rate of change threshold.

25. The method, of claim 21, wherein (he detecting the condition comprises: detecting a value of a power supply voltage being below a power supply voltage threshold, wherein the condition signal comprises a two state signal having the first state resulting from the power supply voltage being below the power supply voltage threshold.

26. The method of claim 21, wherein the detecting the condition comprises: detecting a duty cycle of the PWM signal being below a duty cycle threshold wherein the condition signal comprises a two state signal having the first state resulting from the PWM signal being below the duty cycle threshold.

27. The method of claim 21, wherein the detecting the condition comprises: detecting a duty cycle of the PWM signal being below a duty cycle threshold; and detecting a state of a soft start signal, wherein the soft start signal comprises a two state signal having a state delayed from a startup of the electronic circuit, and wherein the condition signal comprises a two state signal having the first state resulting from the PWM signal being below the duty cycle threshold and in combination with the detected state of the soft start signal.

28. The method of claim 21, wherein the generating the extended PWM signal comprises: integrating a reference voltage to generate a first integrated signal; integrating a signal having a value related to a value of the adjustable average current through the load to generate a second integrated signal; and comparing the first and second integrated signal.

29. The method of claim 21, wherein the generating the extended PWM signal comprises: receiving the PWM signal; receiving the extended PWM signal; receiving the condition signal; and generating an output signal as a selected one of the PWM signal or the extended PWM signal, selected in accordance with a state of the condition signal.

30. The method of claim 21, further comprising: controlling a switching regulator in accordance with the extended PWM signal.

31. An electronic circuit to provide an adjustable average current through a load, the electronic circuit comprising:
   a PWM input node coupled to receive a pulse width modulated (PWM) signal having first and second states with respective adjustable time durations;
   a condition detection circuit configured to identify a condition of the electronic circuit and to generate a condition signal indicative of the condition; and
   a current extension circuit comprising an input node, a control node, and an output node of the current extension circuit coupled receive the condition signal, the control node of the current extension circuit coupled to the PWM input node, wherein the current extension circuit is configured to generate, at the output node of the current extension circuit, an extended PWM signal having a first state and a second state, the first state of the extended PWM signal longer in time than the first state of the PWM signal by an amount related to a value or a state of the condition signal, wherein the current extension circuit comprises:
   a reference integrator coupled to receive a reference voltage and configured to generate a first integrated signal;
   an average current sense integrator coupled to receive a signal having a value related to a value of the adjustable average current through the load and configured to generate a second integrated signal; and
   a comparator coupled to receive the first and second integrated signals and configured to generate the extended PWM signal in accordance with a comparison of the first and second integrated signals.

32. The electronic circuit of claim 31, wherein the longer time of the first state of the extended PWM signal is longer by a determined time amount determined in relation to a value of the condition signal.

33. The electronic circuit of claim 31, wherein the longer time of the first state of the extended PWM signal is longer by a predetermined time when the condition signal has a first state and not longer by the predetermined time when the condition signal has a second different state.

34. The electronic circuit of claim 31, further comprising:
   a load connection node configured to couple to the load; and
   a current regulator circuit comprising an input node, an output node, and a current enable node, the current regulator circuit coupled to the load connection node, the current enable node coupled to receive the extended PWM signal, the current regulator circuit configured to pass a predetermined current from the input node to the output node, wherein the predetermined current is passed or not passed depending upon the first or the second state, respectively, of the extended PWM signal.

35. The electronic circuit of claim 31, wherein the load comprises a series coupled string of light emitting diodes.

36. The electronic circuit of claim 31, wherein the condition detection circuit comprises:
   an average current detection circuit configured to generate the condition signal having a value related to the average current through the load.

37. The electronic circuit of claim 31, wherein the condition detection circuit comprises:
   a dv/dt detection circuit configured to generate the condition signal as a two state signal having the first state resulting from a rate of change of a power supply voltage being above a rate of change threshold.

38. The electronic circuit of claim 31, wherein the condition detection circuit comprises:
   a voltage level detection circuit configured to generate the condition signal as a two state signal having the first state resulting from a value of a power supply voltage being below a power supply voltage threshold.

39. The electronic circuit of claim 31, wherein the condition detection circuit comprises:
   a static circuit configured to generate the condition signal as a static signal having a static value.

40. The electronic circuit of claim 31, wherein the condition detection circuit comprises:
   a short duty cycle detection circuit configured to generate the condition signal as a two state signal having the first state resulting from a duty cycle of the PWM signal being below a duty cycle threshold.

41. The electronic circuit of claim 31, wherein the condition detection circuit comprises:
- a soft start short duty cycle detection circuit configured to generate the condition signal as a two state signal having the first state resulting from a duty cycle of the PWM signal being below a duty cycle threshold in combination with a state of a soft start signal, wherein the soft start signal comprises a two state signal having a state delayed from a startup of the electronic circuit.

42. The electronic circuit of claim 31, further comprising:
- a switching regulator control node; and
- a switching regulator controller having an input node, an output node, and an enable node, the output node of the switching regulator controller coupled to the switching regulator control node, the input node of the switching regulator controller coupled to receive a feedback voltage related to the average current through the load, and the enable node of the switching regulator controller coupled to receive the extended PWM signal, wherein the switching regulator controller does or does not generate a switching signal at the output node of the switching regulator controller depending upon the first or the second state, respectively, of the extended PWM signal.

43. The electronic circuit of claim 42, wherein the switching regulator control node is configured to couple to a switching regulator.

\* \* \* \* \*